United States Patent
Koulik et al.

(10) Patent No.: US 7,288,293 B2
(45) Date of Patent: Oct. 30, 2007

(54) PROCESS FOR PLASMA SURFACE TREATMENT AND DEVICE FOR REALIZING THE PROCESS

(75) Inventors: Pavel Koulik, Blaesheim (FR); Mikhail Samsonov, Illkirch-Graffenstaden (FR); Alexander Cherepanov, Illkirch-Graffenstaden (FR); Evguenii Petrov, Illkirch-Graffenstaden (FR)

(73) Assignee: APIT Corp. S.A., Sion (CH)

( * ) Notice: Subject to any disclaimer, the term of this patent is extended or adjusted under 35 U.S.C. 154(b) by 180 days.

(21) Appl. No.: 10/397,674

(22) Filed: Mar. 26, 2003

(65) Prior Publication Data
US 2003/0165636 A1    Sep. 4, 2003

Related U.S. Application Data

(63) Continuation-in-part of application No. PCT/IB02/01001, filed on Mar. 26, 2002, and a continuation-in-part of application No. 10/080,495, filed on Feb. 22, 2002, now abandoned.

(30) Foreign Application Priority Data

| Mar. 27, 2001 | (EP) | ................................. 01810318 |
| Sep. 20, 2001 | (EP) | ................................. 01810915 |

(51) Int. Cl.
| H05H 1/24 | (2006.01) |
| H05H 1/46 | (2006.01) |
| B06B 1/02 | (2006.01) |
| B05D 3/06 | (2006.01) |
| B05D 3/12 | (2006.01) |
| H05H 1/03 | (2006.01) |

(52) U.S. Cl. ...................... 427/535; 427/540; 427/560; 427/569; 427/600

(58) Field of Classification Search .................... None
See application file for complete search history.

(56) References Cited

U.S. PATENT DOCUMENTS 4,341,111 A * 7/1982 Husar ........................ 73/64.42

(Continued)

FOREIGN PATENT DOCUMENTS

DE             3900768          2/1990

(Continued)

OTHER PUBLICATIONS

Database WPI Section Ch, Week 9407, Derwent Publications Ltd., London, GB, Class M22, AN 1994-054827 XP002226209 & RU 2 000 890 C (Krai Prodn Trading Assoc), Oct. 15, 1993.

(Continued)

*Primary Examiner*—Marianne Padgett
(74) *Attorney, Agent, or Firm*—Clifford W. Browning; Krieg DeVault LLP

(57) ABSTRACT

A process for plasma treatment of an object's surface to be treated comprising the creation of a plasma, the application of the plasma to the surface to be treated, and the excitation of the surface to be treated, such that it vibrates and undulates. The energy for excitation of the surface may come from the process creating the plasma, from an external source, or from a combination of these two sources. The vibration preferably takes place while the plasma is being applied to the surface to be treated, but depending on the treatment to carry out, it may also take place just prior to and/or just after the application phase.

22 Claims, 13 Drawing Sheets

U.S. PATENT DOCUMENTS

| | | | | |
|---|---|---|---|---|
| 4,937,094 | A | * | 6/1990 | Doehler et al. ............. 427/574 |
| 4,981,717 | A | * | 1/1991 | Thaler |
| 5,104,634 | A | * | 4/1992 | Calcote ...................... 423/446 |
| 5,254,237 | A | * | 10/1993 | Snaper et al. .......... 204/298.41 |
| 5,547,716 | A | * | 8/1996 | Thaler ........................ 427/577 |
| 5,556,418 | A | * | 9/1996 | Pappas .......................... 607/1 |
| 5,569,502 | A | | 10/1996 | Koinuma et al. |
| 5,618,619 | A | * | 4/1997 | Petrmichl et al. ........... 428/334 |
| 5,738,920 | A | * | 4/1998 | Knors ....................... 428/35.9 |
| 5,874,134 | A | * | 2/1999 | Rao et al. ................... 427/446 |
| 5,932,302 | A | * | 8/1999 | Yamazaki et al. .......... 427/577 |
| 6,480,074 | B1 | * | 11/2002 | Kaitila et al. ............... 333/188 |
| 6,610,368 | B2 | * | 8/2003 | Schmitz et al. ............. 427/447 |
| 7,172,790 | B2 | * | 2/2007 | Koulik et al. ............... 427/212 |
| 2001/0018127 | A1 | * | 8/2001 | David et al. ................ 428/404 |
| 2002/0160125 | A1 | * | 10/2002 | Johnson et al. ............. 427/569 |

FOREIGN PATENT DOCUMENTS

| | | |
|---|---|---|
| DE | 4128779 | 3/1992 |
| WO | WO 9946964 | 9/1999 |

OTHER PUBLICATIONS

Japanese Abstract of JP 01111333, Published Apr. 28, 1989, to Kanamori, Jun, "Dry Etching Apparatus".

Japanese Abstract of JP08078745, Published Mar. 22, 1996, to Sato Junichi, "Dry Etching Method of Niobium Thin Film".

* cited by examiner

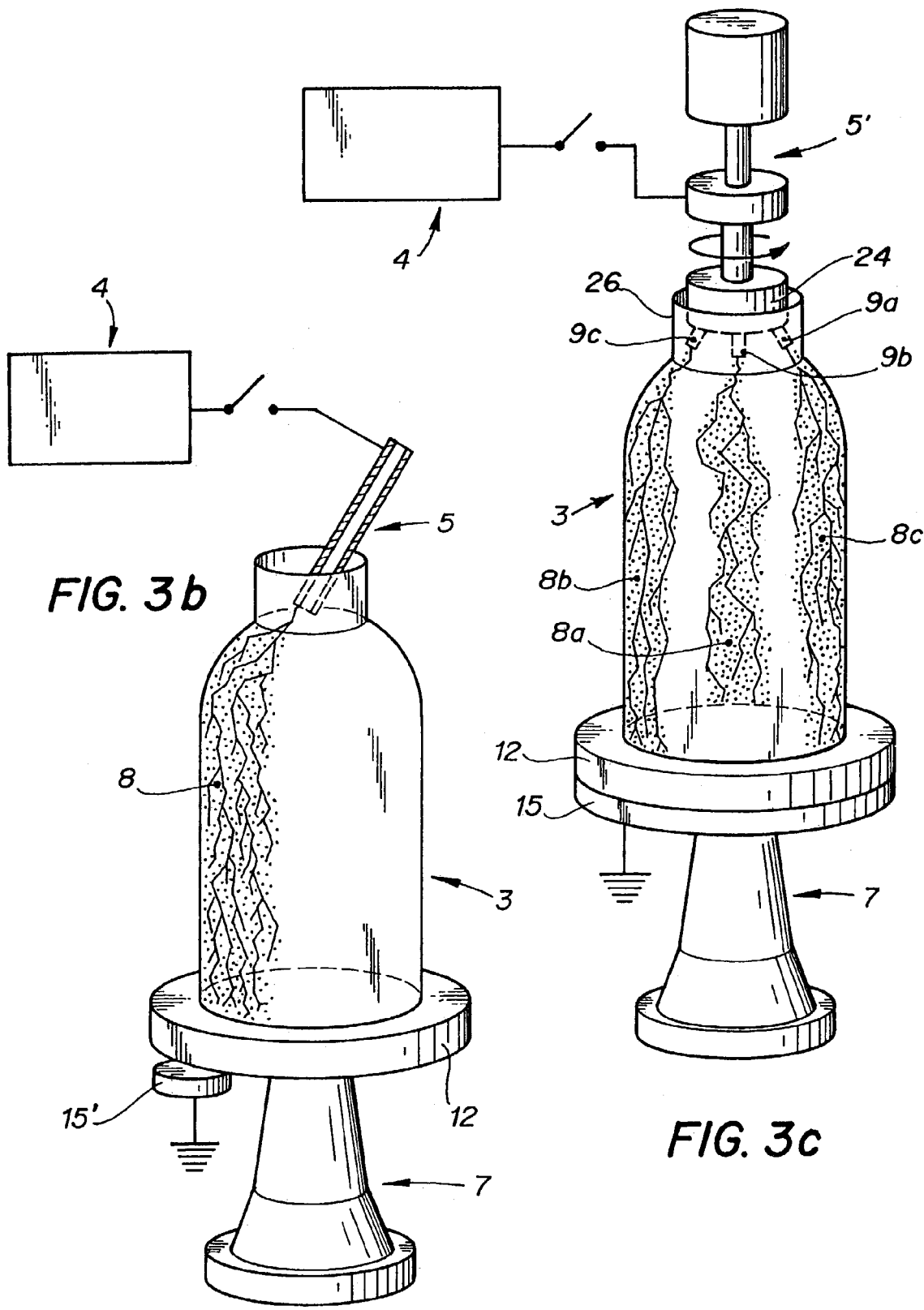

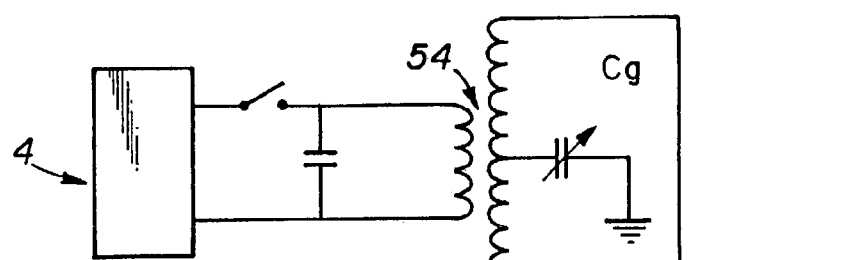
*FIG. 12*
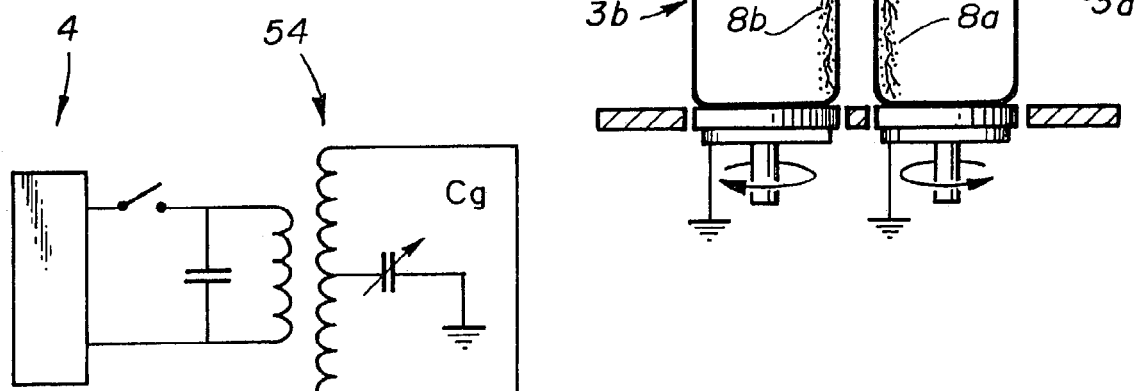
*FIG. 13*
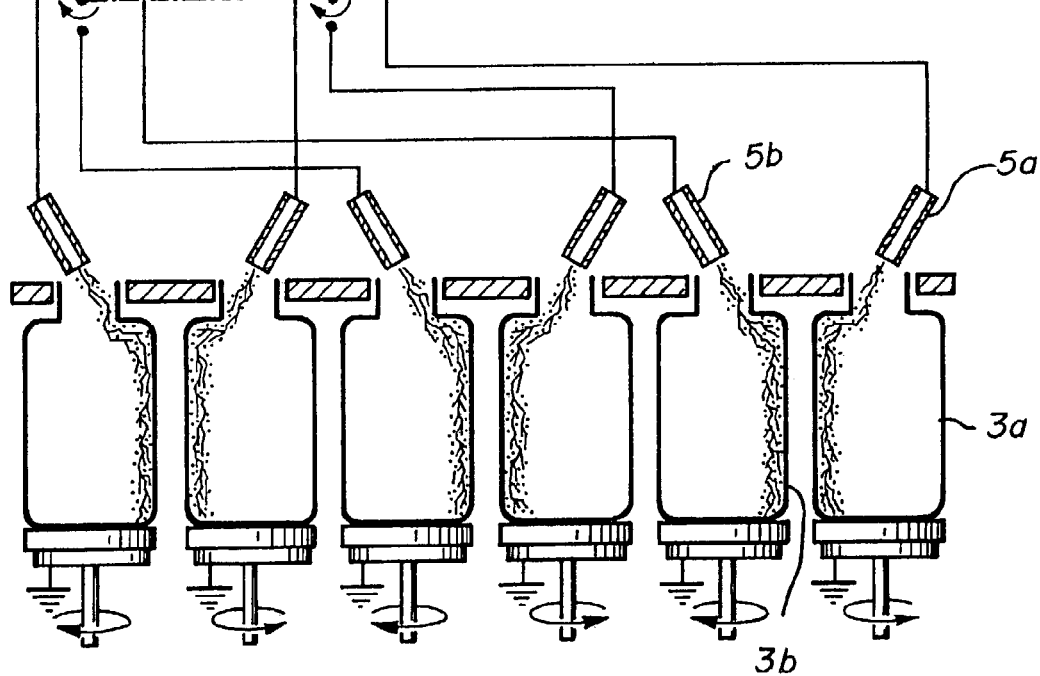

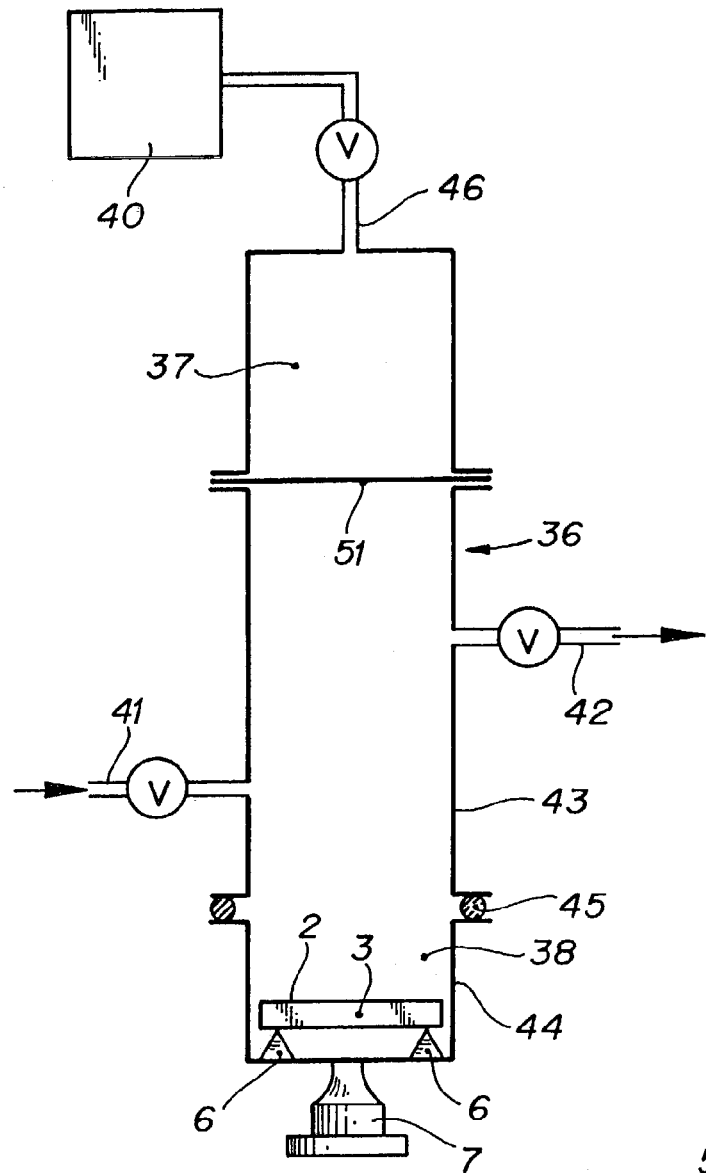
FIG. 15a
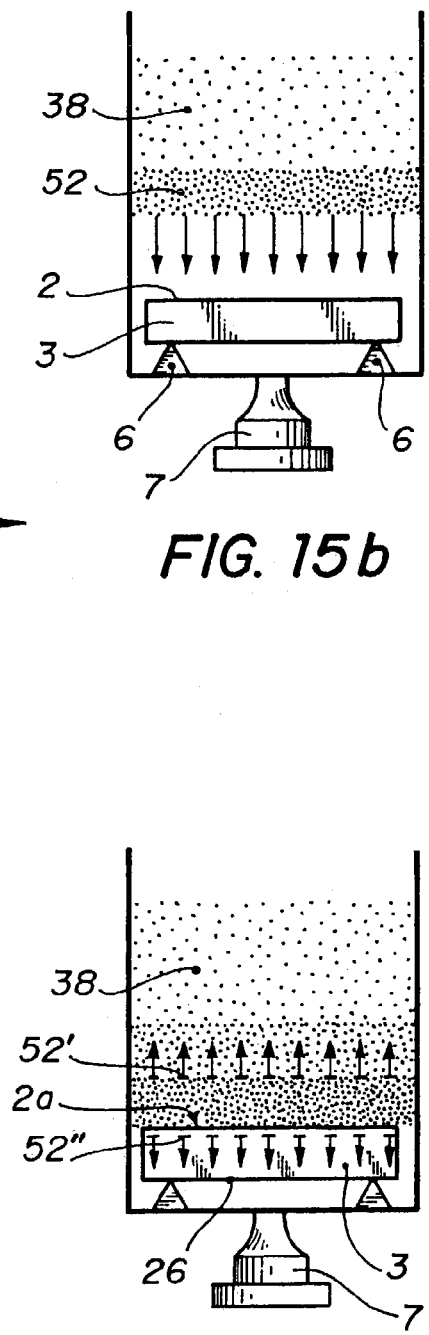
FIG. 15b
FIG. 15c

PROCESS FOR PLASMA SURFACE TREATMENT AND DEVICE FOR REALIZING THE PROCESS

This application is a continuation-in-part of International Application No. PCT/IB02/01001, filed Mar. 26, 2002; and a continuation-in-part of U.S. patent application Ser. No. 10/080,495, filed Feb. 22, 2002 now abandoned.

The present invention concerns a process for plasma surface treatment and a device for realization of the process. The treatment can be deposition of a barrier film or plurality of thin films, sterilization, cleaning, etching, or creation of a surface alloy. The present invention also concerns a process for treatment or production of powders with plasma.

In the current state of the art, plasma depositions are offered in vacuum and at atmospheric pressure. The vacuum technologies provide for a uniform treatment of complex surfaces such as the inner surface of a PET bottle, but they are slow and relatively expensive, since it is necessary to create, and work in, a vacuum chamber. The corresponding equipment is complex, extremely costly, and difficult to adapt to different types of container. The requirement that the equipment be perfectly tight is very difficult to satisfy and has repercussions on the reliability of the process and uniformity of the results.

Processes working with plasmas at atmospheric pressure have been discussed in several publications, for instance the patent GB 1,098,693, the patent application WO 97/22369, and the patent application WO 99/46964.

In the patent GB 1,098,693, a device for treatment of the inner surface of a plastic bottle designed to sterilize this surface is described. The device comprises a central electrode introduced into the bottle and an external electrode surrounding the bottle, the two electrodes forming a coaxial system connected to a high-frequency current source. Argon (Ar) is introduced into the bottle through a hole in the central electrode in order to reduce the electric potential needed to create the plasma. The device described in this patent is characterized by a high electric field, of the order of 450 V/cm, and a very weak current, of the order of a few milliamperes. The treatment time is too long and the power too low for this process to find industrial application and to be able to compete with the vacuum plasma techniques.

In the patent application WO 97/22369 concerning the sterilization of plastic containers, it is proposed to form a plasma with a source of RF current providing a high-amplitude current. It is proposed, moreover, to take the central electrode out of the bottle, which permits a rhythm of PET bottle sterilization in line with industrial needs. It is a disadvantage of the process and of the device described in this application that they will not permit a uniform treatment of the surface to be treated. It is to be expected that the plasma covers only part of this surface. This results in poor sterilization of surface parts that have not been in contact with the plasma. For the same reasons such a process would not be able to provide a uniform barrier all over the inside walls of a container.

In the patent application WO 99/46964, a surface treatment process is described where a pulsed plasma string is formed at atmospheric pressure which sweeps the surface to be treated by relative motion of this surface and the device producing and defining the plasma string. One might expect that such a process would be able to yield a layer that is impermeabilizing, for instance, or could uniformly sterilize the surface to be treated, since the plasma string sweeps all of the surface to be treated. In reality it is found to be difficult to obtain a surface treatment, and more particularly the deposition of a film or a sterilization of satisfactory quality.

For reasons of local heating the plasma column must be moved relative to the surface to be treated. The velocity dictated by the need not to overheat the material of the surface to be treated is higher than the optimum speed of treatment in many applications. One of the consequences is that a boundary layer of cold gas drawn along by the object blows into the discharge and moves it away from the surface to be treated. This removal lowers the diffusive flux of active plasma particles toward the surface to be treated. This problem can be resolved in part by renewing the discharge by pulses. However, the pulse frequency is also dictated by the need not to overheat the material of the surface to be treated, and hence cannot be optimized for different applications.

The volume of plasma created by known processes for atmospheric plasma treatment is large and leads to poor yields, since large part of the energy input is lost for heating the surrounding gas and the object to be treated. For applications involving the deposition of barrier films, on the other hand, powder forms in the bulk of the plasma string ($SiO_2$ powder, for instance) and deposits on the surface to be treated. This powder, which adheres but weakly to the surface, represents an obstacle to the creation of high-quality films.

The disadvantages and limitations of known plasma treatment processes are not limited to the points described above. For example, in the case of plasmas close to a thermodynamic equilibrium state, such as would arise from the process described in WO 99/46964, it is difficult to perform an electron bombardment of the surface to be treated, since in general the mean path of the electrons ($\leq 10^{-4}$ cm) relative to the elastic interactions of the surface to be treated is shorter than the thickness of the plasma boundary layer ($\geq 10^{-2}$ cm). It follows that it is difficult for such a process to adapt the substrate/film interface to a desired quality of treatment, for instance by activating the surface to be treated prior to film deposition so as to ensure good adhesion. It follows that it would be equally difficult to produce films consisting of several layers differing in their composition, with each layer being activated prior to deposition of the following layer.

Experience shows that despite the relative motion of the plasma and object to be treated in known processes, local overheating is inevitable and provokes electrical discharge breakdowns that give rise to defects and local destruction of the surface to be treated. This disadvantage is particularly important in certain applications, as will be explained by way of example hereinafter.

Polymerizable materials such as PET (polyethyleneterephthalate), PE (polyethylene), PP (polypropylene) and others are used in various industries for products such as containers for beverages and food, the pharmaceutical and perfume bottles and tubes, gasoline tanks, containers for chemical products, as well as the neon tubes for night-time advertising, particularly for reasons of low cost and weight of these materials. Yet one of the disadvantages of polymeric materials is their gas permeability. The permeability of the PET bottles used in the food industry, for instance, lets oxygen diffuse through the bottle wall and oxidize the food or beverages, which for this reason progressively lose their properties such as their taste, odor or color. Carbonated beverages to the contrary lose their carbon dioxide. Excessive plastic container permeability shortens the time of conservation of the foods. Gas diffusion across the plastic walls can have ill effects on large number of other products such as pharmaceuticals, cosmetics, hygiene and housekeeping products. In the case of gasoline tanks or other containers holding chemicals, the permeability of the plastic materials allows these chemicals to penetrate into the plastic material so that this can no longer be recycled easily and may present a fire hazard. The permeability of plastics implies that neon tubes in plastic have a lifetime too short to be marketable.

Another problem of plastic materials arises from aromatic molecules such as acetaldehyde forming in the bulk material and then diffusing toward the surface where they enter the liquid held by the container. Such molecules alter the taste and odor of the beverage or food item.

One solution consists in coating the inside of the container by an impermeable film called "barrier". Different compositions such as carbon, aluminum oxide, and silicon oxide ($SiO_2$) can form barriers on polymers. The deposition of a barrier film can be carried out by plasma in contact with the surface, and in the presence of a gas furnishing the molecules that will form the layer. However, the plastic materials mentioned above do not withstand temperatures above around 60 to 70° C., so that it is difficult with the known plasma treatment processes to avoid local overheating or obtain a sufficiently high quality of the treatment. For instance, the barrier films deposited on PET bottles by traditional industrial plasma treatment processes yield a factor (RIF) of impermeability enhancement relative to the untreated material that is of the order of 20 to 30 for oxygen or 5 to 6 for $CO_2$. Typical defects of such barrier layers are lack of adhesion and flexibility and the appearance of cracks leading to a loss of impermeability. These defects may also represent a hazard for the consumer.

Many other materials do not withstand the temperature rise that would be required for optimizing the plasma surface treatment process. This is the case, for instance, with the silicon wafers used in semiconductor industry. The semiconducting structures at the surface of the circuits can in fact be altered or damaged by high treatment temperatures because of an accelerated particle diffusion across the interfaces of the different layers deposited on the silicon wafer.

As concerns powders, in particular powders formed of composite grains, physical, chemical methods of powder production are known for producing grains comprising a core and a peripheral layer or zone. The composition of the peripheral zone or outer layers may be different to that of the core. Known methods of the disadvantage of being relatively slow and costly, and moreover do not enable the formation of very thin uniform outer layers.

It is known to produce non-composite powders from a gas by means of a plasma treatment. Known powder producing methods consume a lot of energy and are relatively slow and costly.

In view of the drawbacks cited above, it is an objective of the present invention to provide a plasma surface treatment process that is performant and reliable in an industrial environment, as well as a device for performing a plasma surface treatment process that is performant and reliable in an industrial environment.

It is a further object to provide a plasma surface treatment process as well as a device for realizing the process that can be used to treat the surfaces of materials that are sensitive to high temperatures.

It is a further object of the invention to be able to deposit a barrier on containers (particularly plastic containers such as PET bottles in the food industry, polyethylene tubes in perfumery, and gasoline tanks in the automobile) that is strong, flexible and has a good impermeability. It would be advantageous to be able to simultaneously treat the inner and outer surfaces of hollow objects (bottles, tubes, tanks). It is advantageous to be able to treat the surface of a complex object.

It is another object of the invention to provide a plasma surface treatment process as well as a device for realizing the process that can be used to deposit several layers of different materials on a surface to be treated.

It is another object of the invention to provide a plasma surface treatment process as well as a device for realizing the process that can be used to deposit one or several layers of different materials on the surface of a sub-micronic or nanometric core or nucleus, thereby producing powders with composite grains.

It is an object of this invention to provide a process for producing powder grains with outer or superficial layers surrounding the core or nucleus of the grain having a good uniformity and a specified thickness.

It is advantageous to provide a method for producing composite powder grains of sub-micronic or nanometric size, that is efficient and low-cost.

It is advantageous to provide a method for producing composite powder grains formed of a nucleus and one or more outer layers surrounding the nucleus, the powder having different physical, chemical properties than the properties of the nucleus alone.

Another object of the invention is to provide a method of producing powders from a gas, by means of plasma treatment, that is efficient, low-cost and that enables the production of powders of high quality.

It is advantageous to provide a method of producing powders formed of mono-crystalline grains of nanometric size.

It is also advantageous to be able to perform other surface treatments such as cleaning, etching, surface activation, sterilization or the formation of surface alloys.

It would also be advantageous in many applications, moreover, to realize a process of plasma surface treatment at atmospheric pressure as well as a device for realizing the process.

Objectives of the invention are realized by the process according to claim 1.

In the present invention, a process for plasma treatment of an object's surface to be treated comprises the creation of a plasma, the application of the plasma to the surface to be treated, and the excitation of the surface to be treated, such that it vibrates and undulates. The energy for excitation of the surface may come from the process creating the plasma, from an external source, or from a combination of these two sources. The vibration preferably takes place while the plasma is being applied to the surface to be treated, but depending on the treatment to carry out, it may also take place just prior to and/or just after the application phase.

The energy for excitation of the surface that comes from the process creating the plasma can advantageously come from a shock wave developing at the plasma front during its creation. The shock wave is created by arranging that the front of plasma development will create within the plasma a pressure such that its ratio to the ambient pressure be above the critical value for formation of a shock wave in the given gaseous medium. This is obtained by selection and control of the plasma generation parameters, particularly the energy density and the lifetime of the plasma development front.

The energy for surface excitation coming from an external source can come from a vibration generator brought in contact with the object to be treated, or not in direct contact with the object to be treated, which emits acoustic waves, for instance ultrasonic waves. For many applications and many objects to be treated, the vibration frequency will advantageously be within the range of ultrasonic frequencies. The external generator can also furnish enery in the form of shock waves.

The vibration of the surface to be treated can be the result of excitation of one or several eigenfrequencies and their harmonics associated with the body of the object to be treated, by an abrupt leap of energy (shock) and/or by the action of an external generator emitting one of several frequencies close to or identical with eigenfrequencies or their harmonics associated with the object to be treated. The vibration of the surface to be treated can also result from forced frequencies when an external generator emits frequencies that are not harmonics of the eigenfrequencies of the object to be treated.

For most applications the plasma is preferably created with an electrical or electro-magnetic energy source operated continuously, by unipolar or alternating pulses, or at high frequency. This may for instance be a discharge of the capacitive or inductive type, or high-frequency waves. However, the plasma can also be created by adiabatic compression or by shock waves, furnished for instance by an adiabatic-compression or shock-wave generator.

The plasma created by a surface treatment process according to advantageous embodiments of the invention may be in thermodynamic disequilibrium for large part of the plasma's lifetime.

The process according to the invention is very advantageous, since it permits utilization of a cold plasma while intensifying the interaction of the plasma with the surface to be treated, and hence to optimize the plasma surface treatments for a large range of applications, including treatments of objects consisting of materials withstanding only a very slight temperature increase, such as PET and semiconductors. The wave motion of the atoms and molecules of the surface to be treated actually intensifies the effect of the activated plasma particles on the surface to be treated. Because of the intensified effect, one has a larger choice of plasma generation modes (adiabatic compression, shock waves, electrical discharge) and can optimize the process depending on the features (material, shape, dimensions) of the object to be treated and treatment to be performed. It is possible in particular to use a "cold" atmospheric plasma (as defined by R. F. Baddour and R. S. Timmins in "The Applications of Plasmas to Chemical Process", MIT Press, page 17), that is, out of thermodynamic equilibrium, so that the insulating surface to be treated remains cold while electrons can bombard the surface to activate it. This plasma can for instance consist of a network of filaments that appear, move along the surface, and disappear within times sufficiently short to not heat up the surface to be treated. As concerns the surface treatment of powder grains, the plasma may for example be formed within the volume of a recipient containing the powder grains.

The process according to the invention also permits, on one hand an acceleration of the surface treatment, in that the ionization and activation of the plasma particles is produced with the aid of shock waves issuing from discharge filament branches while these are reflected by the surface to be treated, and on the other hand an intensification of the surface treatment without any important increase in temperature of the object to be treated, since the vibrations of the surface to be treated act upon the interaction with the plasma, essentially like the atomic agitation produced by an increase in temperature of the object.

The surface treatment can be further intensified by adding the vibrations of an external acoustic frequency or ultrasound generator, preferably adjusted so as to amplify the eigenfrequencies of the object to be treated. The improved interaction of the plasma with the surface to be treated at low temperature has many other advantageous consequences. For instance, composite films of good quality can be obtained by the successive deposition of layers that adhere well to the substrate and have different physical, physico-chemical, and mechanical properties.

It is another advantage of the process according to the invention that it permits treatment of the inner walls of a complex object lacking axes of symmetry, such as a gasoline tank.

In a process according to the present invention, it is also possible to produce powders formed of grains comprising a core or nucleus and a peripheral zone or outer layers of one or more different layers resulting from the deposit of a substantially uniform and homogeneous film of atoms and/or molecules that may provide the powder with properties that are different from the properties of the powder comprising only the nucleus material, for example optical properties.

In the present invention, the composite powders may be made by depositing films on grain nuclei by means of a plasma at atmospheric pressure. The plasma serves on the one hand to heat and activate the surface of the grain nuclei for their entry into contact with the atoms and/or molecules of gas used to form the outer layers.

The same plasma, or plasma generated downstream of the plasma activating the grain nuclei with an independent plasma generator, activates the atoms and molecules of a gaseous mixture comprising gases and/or vapors that are superheated. When the nuclei are brought into contact with the gaseous atoms and molecules, the plasma deposits a substantially homogenous molecular or atomic film on the surface of the nuclei which give the resulting powder physical chemical properties different from a powder comprised only of the nuclei, for example the optical properties may be changed.

The parameters controlling the plasma are chosen such that the film deposit is particularly homogeneous and very thin.

The components of the plasma generating the film are chosen such that the forces of attraction between the particles (atoms or molecules) of the film have a centripetal component that assists in solidifying the structure of the peripheral layer or film. The smaller the size of the nuclei, the larger this centripetal component is. It is therefore particularly important in the case of sub-micronic or nanometric nuclei. In such cases, in order to separate effectively the grain nuclei floating in the supplied gas (for example argon) and to apply a vibration movement that catalyzes the process of surface deposition, the nuclei may be subjected to acoustic vibrations, in particular ultrasonic vibrations that may be generated by an external generator or that may generated by the plasma itself, in a mode of generation of plasma by impulsions, as described herein below.

According to another aspect of the invention, a process of producing powders comprises the generation of a plasma in pulses in a container comprising gases, and by the simultaneous generation of acoustic vibrations in the container, the gases being decomposed by the plasma in order to form clusters and powder grains in which the degree of structuration is determined by the simultaneous action of the plasma and the acoustic vibrations. The acoustic vibrations may be produced by an external generator and/or by the process of creation of the plasma itself, as described herebelow.

A device of plasma surface treatment according to the invention can advantageously comprise an external acoustic vibration generator.

A device of plasma surface treatment according to the invention can advantageously comprise a vibration pickup. The vibration pickup allows one to check and/or analyze the eigenfrequencies of the object to be treated, in order to adjust the device, for instance the parameters of the electrical circuit for generation of the electric discharge for creation of the plasma, for the production of shock waves which will produce vibration of the surface to be treated of a specific object to be treated, or for verifying the perfect functioning of the process and particularly the quality of the vibrations of the surface to be treated in an industrial process. In the presence of variations in the expected frequency and amplitude spectra, one might thus be informed about a possible failure or quality reduction of the surface treatment being carried out.

A device of plasma surface treatment according to the invention can advantageously comprise one or several live electrodes provided with one or several process gas supply ducts for generation of one or several plasma jets by electrical discharge. The live electrode can advantageously be rotating, so that it will be able to move the plasma or plasmas by electristatic and hydrodynamic effects along the surface to be treated.

The device may comprise a live electrode that is in the form of a liquid jet that can execute a motion relative to the object to be treated, in order to project a conducting liquid jet against a wall of the object to be treated so that a plasma is created on the other side of the wall.

According to an embodiment of the invention, the electrodes for plasma generation by electrical discharge can be connected to the opposite poles of an electrical circuit. These electrodes can be utilized to generate a plasma on both sides of a wall of an object to be treated, the fluxes of the plasma being antiparallel on the two sides.

One can also furnish a device with at least two live electrodes in order to treat respective sides of one wall of an object to be treated, the plasma fluxes on the two sides being parallel and directed toward a grounding electrode.

A plasma surface treatment device according to the invention can advantageously comprise a liquid bath into which the objects to be treated, particularly containers, are immersed while plasma is applied to the inner surface to be treated. This can for instance be bottles or other containers partly immersed into the liquid bath, with their neck remaining above the surface of the liquid. The liquid thus is in contact with the outside of the container, which offers the advantage that the container wall can be cooled very efficiently and the plasma applied for a longer time. When an external source of vibrations is used, then the liquid will on the other hand serve to make the vibrations more uniform across the container wall, and thus on the container's inner surface to be treated.

A plasma surface treatment device according to the invention can advantageously comprise a system of surface quality control after or during the treatment with a laser beam recording, either the number of photons emitted by non-linear effects during passage of the laser beam across the surface treated, or the decrease of the flux of primary protons due to their recombination resulting from non-linear effects, the laser beam system being provided with a device for the detection and analysis of the beam reflected from the surface to be treated or traversing the surface to the treated.

A plasma surface treatment device according to the invention may comprise an enclosure in which the objects to be treated are arranged, and a piston for compressing the process gas in the section of the enclosure where the objects to be treated are arranged, so as to create a plasma by adiabatic compression. The piston can be driven by a device with compressed air or other gases located in the section of the enclosure above the piston.

A plasma surface treatment device according to the invention may advantageously comprise an enclosure with one section where the objects to be treated are arranged, and with another section where a process gas is kept under pressure and which is separated from the other section by a wall that can be removed or destroyed in order to permit instant decompression of the compressed gas for the purposes of creating a shock wave that moves in the direction of the objects to be treated.

Other advantageous aspects of the invention will become apparent from the claims, from the following description and from the attached drawings in which:

FIGS. 3a to 3c are simplified perspective views of devices for plasma surface treatment according to embodiments of the invention, in these particular cases for the treatment of inner walls of bottles;

Figure 4B:
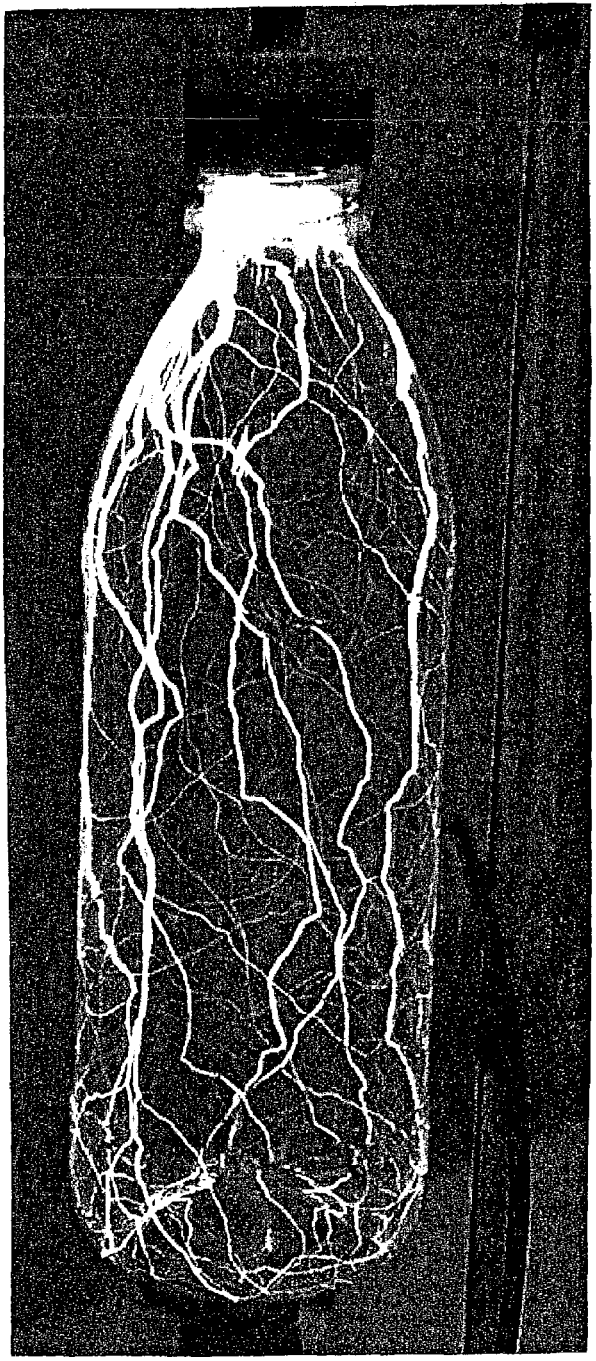
Figure 4A:
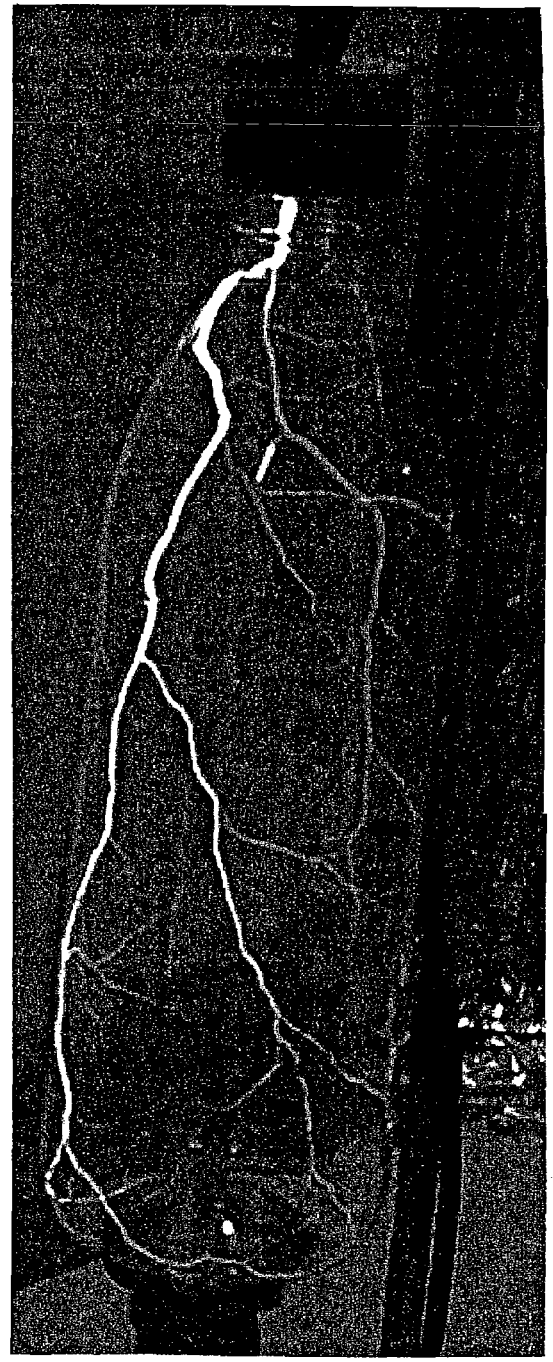
Figure 5:
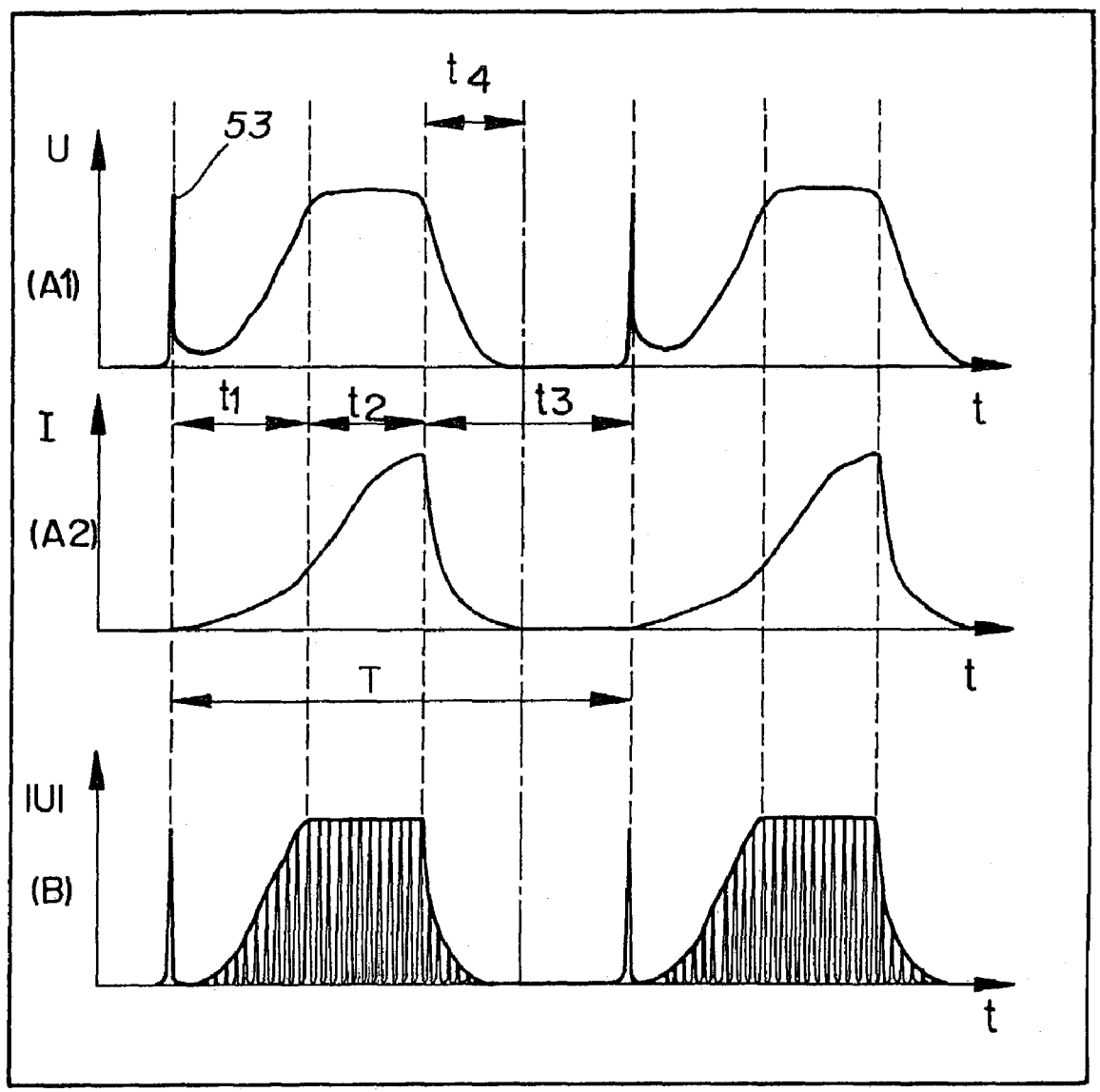
Figure 7:
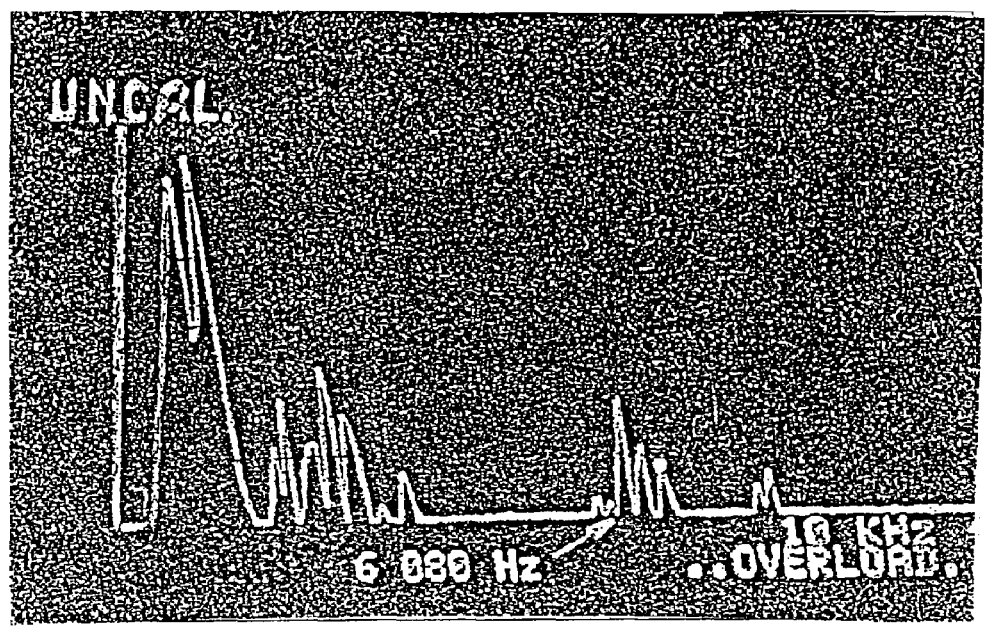
Figure 6:
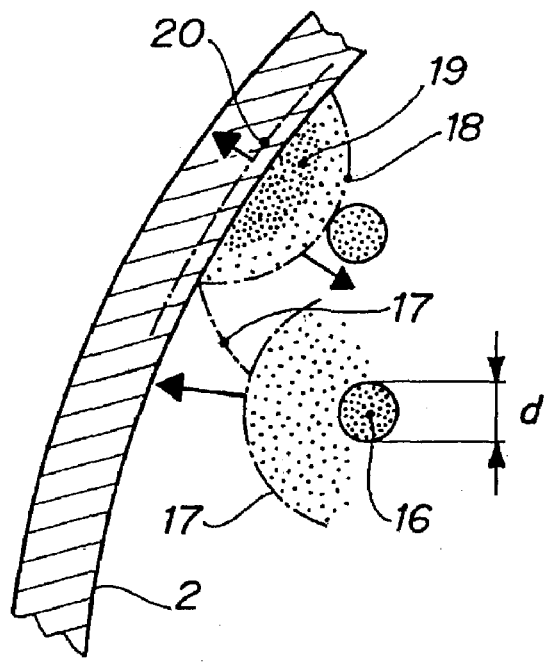
Figure 8:
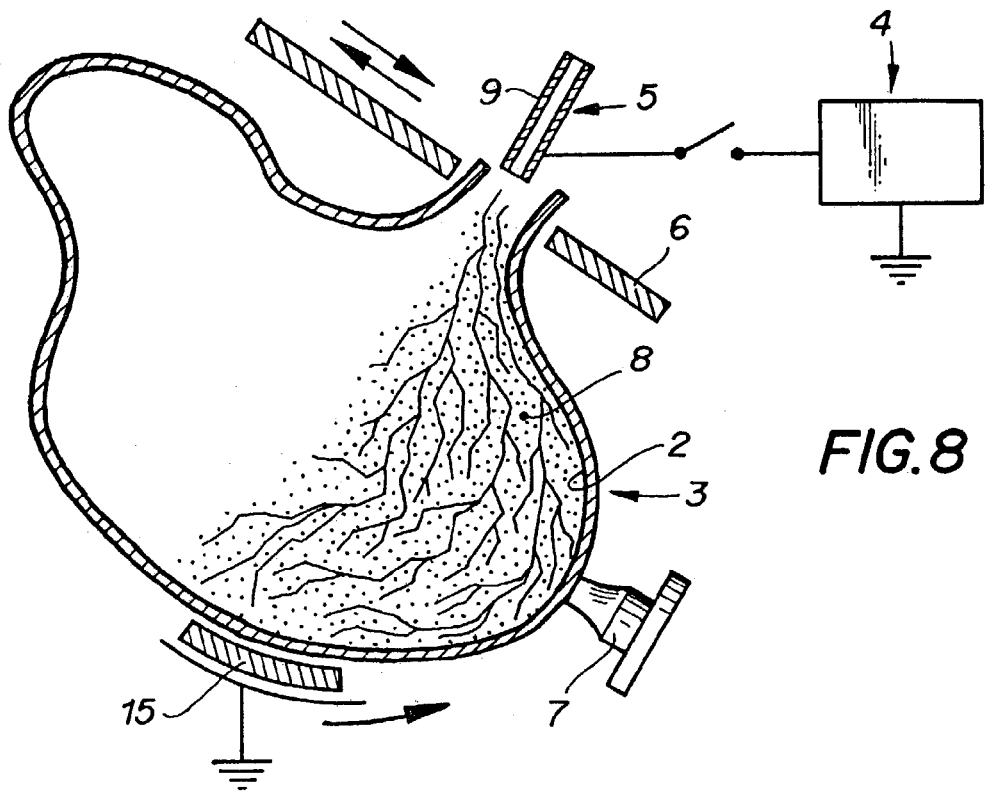
Figure 9:
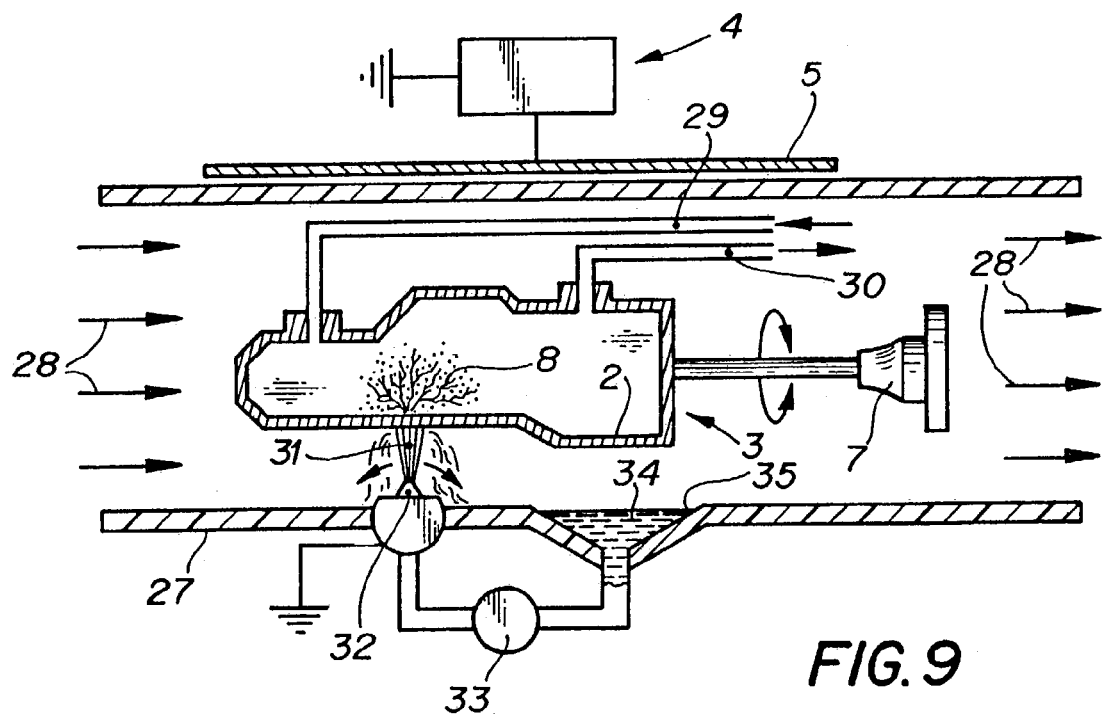
Figure 10:
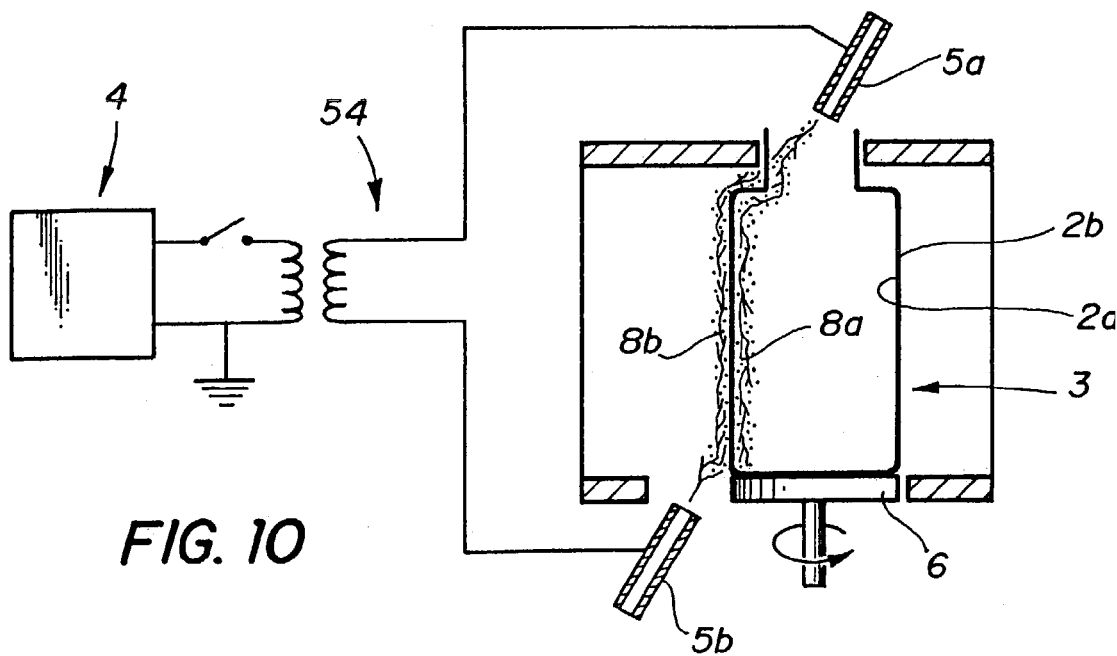
Figure 11:
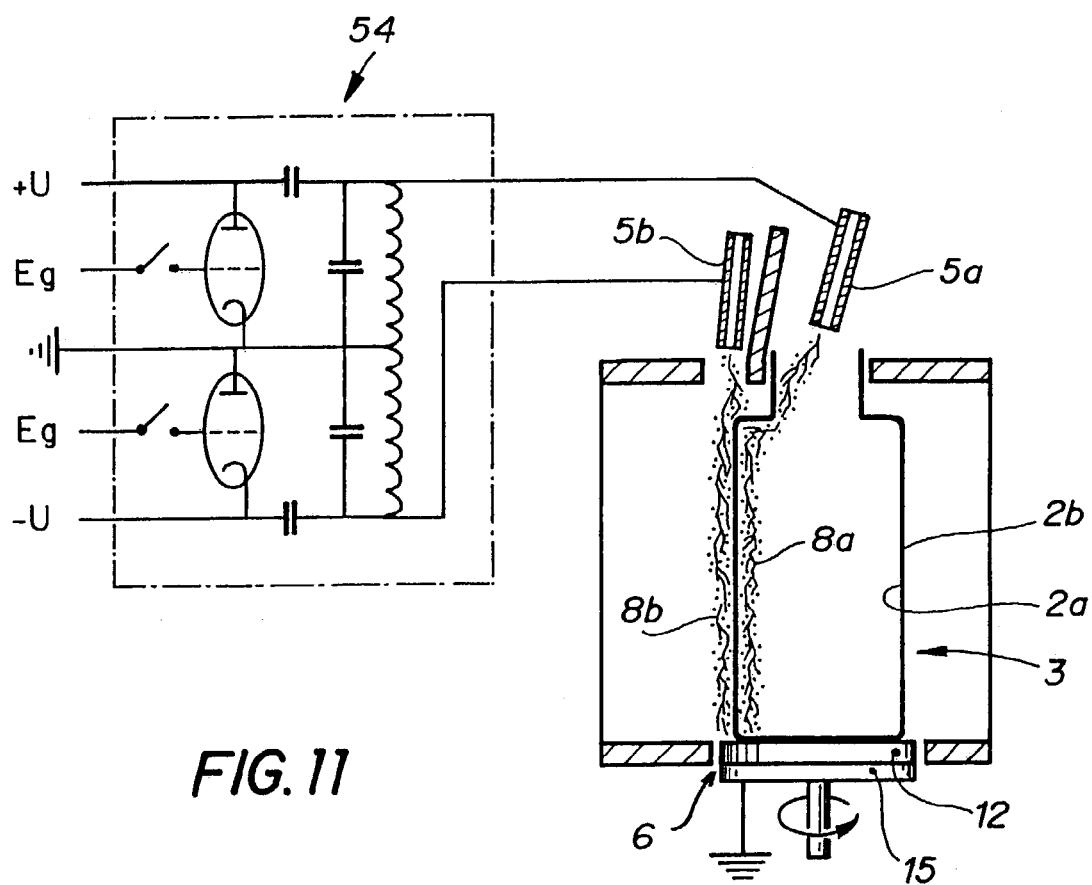
Figure 14:
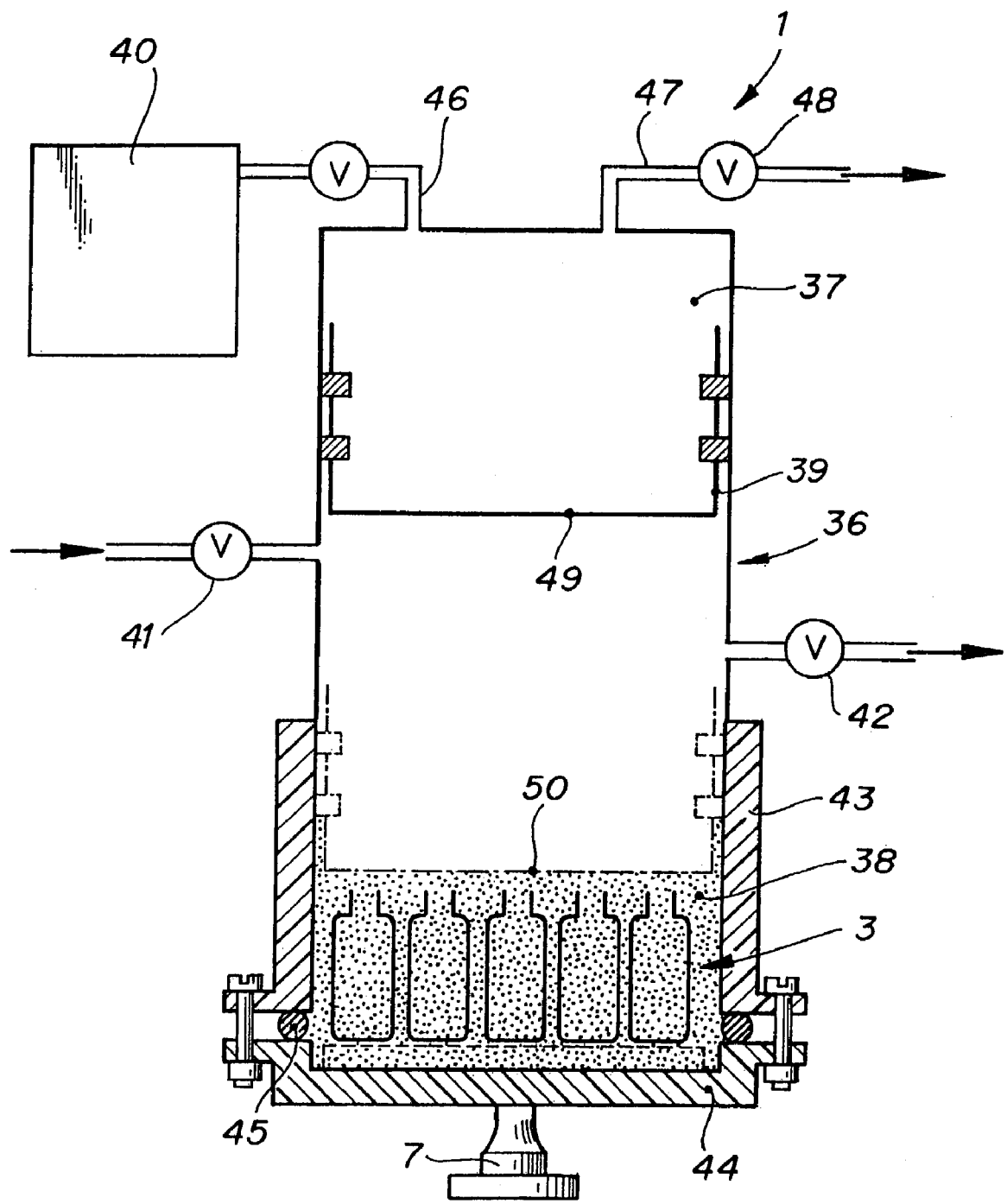
Figure 16:
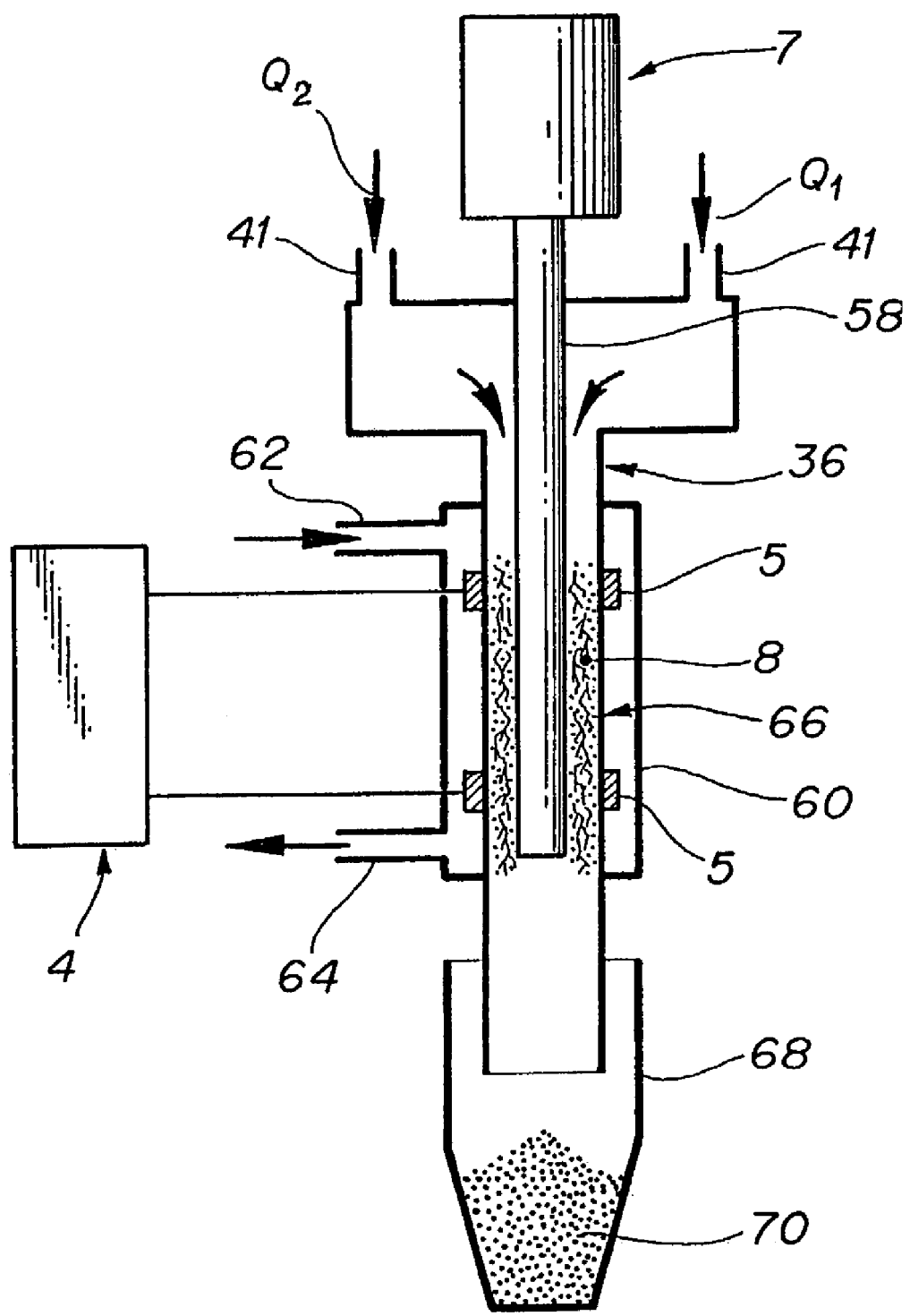

FIGS. 4a and 4b are high-speed photographs of PET bottles obtained during their plasma surface treatment according to the invention, where the treatment of FIG. 4a uses a process gas prepared from a mixture of hexamethyldisiloxane, oxygen, and argon, and the treatment of FIG. 4b uses argon alone as a process gas, the electrical power supplied in the treatment of FIGS. 4a and 4b also being different;

FIG. 5 illustrates plots of voltage U and current I as functions of time for a plasma generated by electrical pulse discharges according to the invention, either in a unipolar mode (plots A1 and A2) or in a high-frequency mode (plot B);

FIG. 6 is a sectional view across part of the wall of an object to be treated during a plasma treatment according to the invention;

FIG. 7 is a view of an oscilloscope screen connected to a vibration pickup measuring the vibrations of an object to be treated during a plasma treatment according to the invention, here of an 0.5-liter PET bottle during treatment by an electrical pulse discharge with the aid of a high-frequency generator producing a branched network of plasma filaments according to the invention;

FIG. 8 is a simplified sectional view of a plasma surface treatment device for a container of complex shape according to the invention;

FIG. 9 is a simplified sectional view of another embodiment of a device for plasma treatment of a container of complex shape where the grounded electrode is in the form of a conducting liquid jet;

FIG. 10 is a simplified sectional view with an electric circuit diagram of a device for plasma surface treatment of the two sides of a container wall according to the invention;

FIG. 11 is a view similar to that of FIG. 10 of another variant according to the invention;

FIGS. 12 and 13 are simplified sectional views with an electric circuit diagram of a device for the plasma treatment of inner surfaces of a plurality of containers such as bottles, the plasma being generated by electrical pulse discharges;

FIG. 14 is a simplified sectional view of a plasma treatment device according to the invention where the plasma is produced by adiabatic (isentropic) compression;

FIG. 15a is a simplified sectional view of a plasma treatment device according to the invention where the plasma is produced by expansion of compressed gas generating a shock wave;

FIGS. 15b and 15c are simplified sectional views of the device of FIG. 15a illustrating the movement of the shock waves and the creation of the plasma; and FIG. 16 is a simplified sectional view of a device for the plasma treatment of powders according to this invention.

Figure 1A:
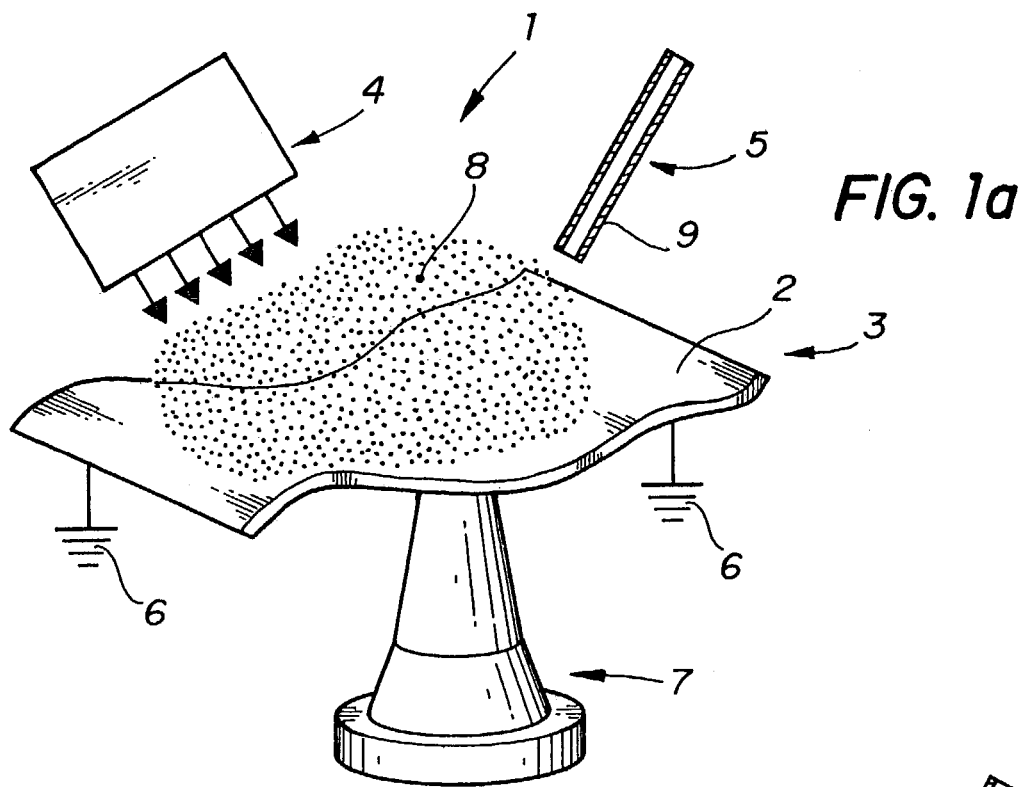
FIGS. 1a and 1b are simplified schematic illustrations of devices for the treatment of surfaces of objects to be treated, according to the invention.
Figure 1B:
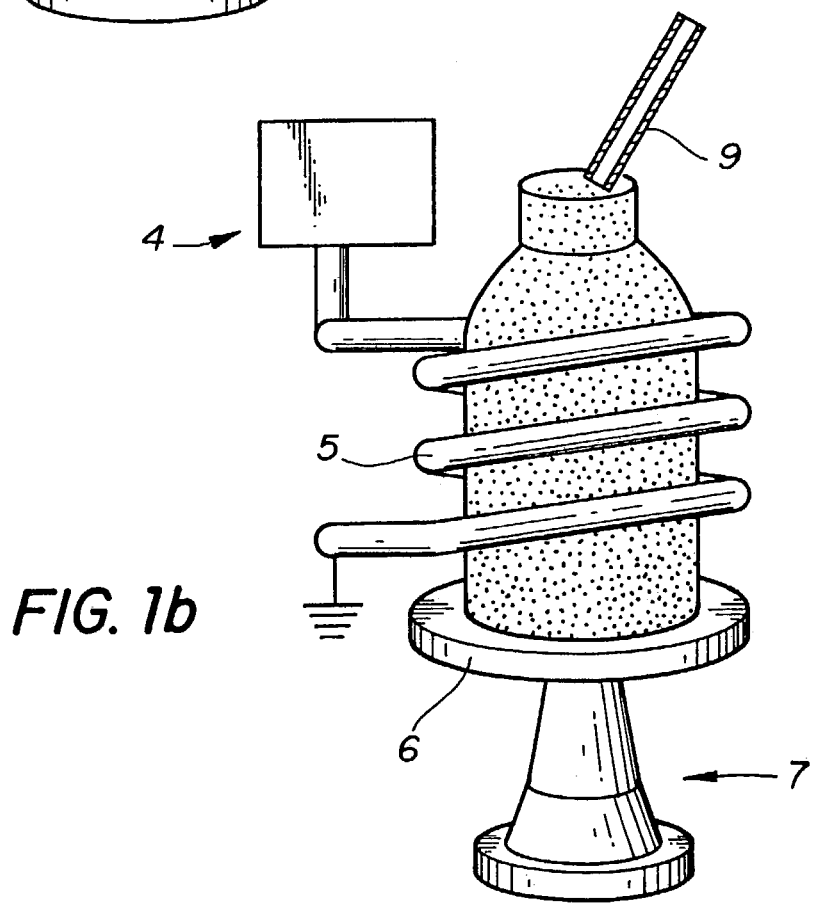

Referring to FIGS. 1a and 1b, a device 1 for the treatment of a surface 2 of an object to be treated 3 generally comprises a device for plasma generation 4 including a gas supply system and an electrode 5, and a holding device 6 for holding the object to be treated. The treatment device 1 may also comprise an external vibration generator 7 that can induce the surface 2 of the object to be treated to vibrate, by means of an oscillator in direct contact with the object or via sonic (acoustic) waves without direct contact.

A plasma 8 is created on the surface 2 of object 3 by the plasma generator 4 in a gas that can be activated plasma-chemically and is directed toward the surface 2 by a duct 9 of the gas supply system, where the duct can be formed within the electrode 5.

The surface to be treated is excited so as to vibrate, that is, it performs a wave motion. The energy needed to generate the wave motion of the surface to be treated can be derived from a shock wave arising in the process of plasma creation, from a shock wave created by an external generator, of from an external vibration generator 7. A shock wave causes a body to vibrate in a transitory mode at its eigenfrequencies. The vibration amplitude can be boosted by an external vibration generator adjusted so as to generate vibrations at one or several eigenfrequencies of the object to be treated. As the vibration modes of bodies are extremely complex, the optimum choice of frequencies may be determined by tests, that is empirically, by adjusting the frequency differently for each of a certain number of samples and determining the features of surface treatment quality.

An analysis of the surface treatment process according to the invention shows that by realizing wave motion of the particles of the surface to be treated one can intensify the physicochemical interaction between the plasma particles and the surface particles. By its nature and effects, this intensification resembles that accompanying an increase in temperature of the surface to be treated when in contact with the plasma, be it a vacuum plasma, an atmospheric plasma or a high-pressure plasma.

Thus, it is a very important aspect of the invention to intensify the process of plasma-chemical interaction, be it for deposition of a film, for etching, the creation of a surface alloy, or other kinds of treatment, without raising in any significant manner the temperature of the object to be treated. This technical solution is very important and opens up wide perspectives, particularly for the plasma treatment of bodies made of material not withstanding heating. On the other hand it allows the effects of a cold plasma on a surface to be valorized in a novel way, that is, the effects of a plasma out of thermodynamic and chemical equilibrium (see the definition on page 27 of the book of Baddour and Timmins cited earlier). The possibility of exciting the surface to be treated by a mechanical vibration while leaving it cold allows one in fact to decisively remedy the disadvantage inherent in the use of a cold plasma on a cold surface, since the interaction between the plasma and the surface to be treated is strongly intensified.

Figure 2A:
FIGS. 2a and 2b are electron-microscopic (SEM) surface photographs of the treated surface of a PET bottle with a silicon-oxide-based barrier.
Figure 2B:
Figure 2C:
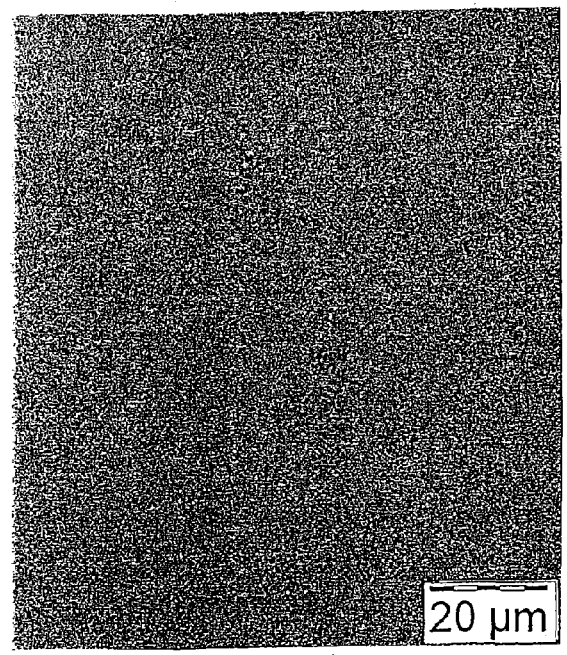
FIG. 2c is a SEM photograph of the treated surface of a PET bottle with a silicon-oxide-based barrier obtained by an atmospheric plasma deposition process according to the invention.

FIGS. 2a and 2b present SEM (Surface Electron Microscope) photographs of the surface of an 0.5-liter-capacity PET bottle after a plasma treatment without excitation of the surface to be treated. In this case a silicon oxide film was deposited. The plasma employed in this example is a HF (high-frequency) pulse discharge plasma generated in a mixture of hexamethyldisiloxane vapors and argon. After the treatment the bottle was mechanically folded, and in these photographs one notices chips 10 and scales 11 formed on the surface. These chips and scales can fall off and become incorporated into the liquid, thus representing a hazard to the consumer. This also increases the permeability of the surface. By tests involving these bottles it could be established that the impermeability RIF (Relative Impermeability Factor) of the barrier film was about 10 for oxygen, relative to an untreated surface. In the case of FIG. 2c the same surface treatment was carried out while adding vibrations having a frequency of about 21 kHz, that is, in the ultrasonic region, with the aid of an external ultrasound generator. The temperature of the PET walls of the bottle was measured during the treatment with a thermocouple, which showed that the temperature did not rise above 45° C. This temperature is well below the maximum temperature of PET treatment, which is about 60 to 70° C. The bottle was then folded mechanically in the same way as the samples of FIGS. 2a and 2b, and one can notice in the SEM photograph that the barrier film obtained is sound and flexible, since neither chips nor scales are formed. The level of impermeability of the barrier film is very high. According to sample measurements, the RIF is about 30 for oxygen, relative to an untreated surface.

It should be noted that the process according to the invention allows one to employ a plasma in vacuum, under atmospheric pressure, or under high pressure, since the action exerted by the vibrations of the surface to be treated on the interaction of this surface with the plasma does not significantly change with the pressure at which the plasma is generated. The treatment efficacy, on the other hand, again does not signicantly change with the manner in which the plasma is generated, be it in a continuous manner, with supply from dc sources, ac sources, high-frequency, microwaves, or pulses. In the latter case, the pulse period is preferably longer than the period of the vibration to which the object to be treated is subjected, in order to make sure that the contact between the plasma and the surface to be treated comes about.

The shock wave originating with plasma creation can be generated by isochoric heating of a fraction of the volume of gas that can be activated plasma-chemically, by emitting an electrical pulse discharge obeying certain parameters, directly into the process gas. The volume fraction in question heats up, its pressure rises rapidly above the critical pressure above which a shock wave forms which propagates throughout the volume of the gas mixture and is followed by a plasma formed by particles of the process gas that are heated, excited, and ionized. This procedure is above all efficient when the electric current pulses are accomplished along the surface of the body to be treated, which consists of insulating materials. It can be used to good advantage to treat a complicated surface such as the inner walls of bottles, tubes, gasoline tanks and other containers.

Figure 3A:
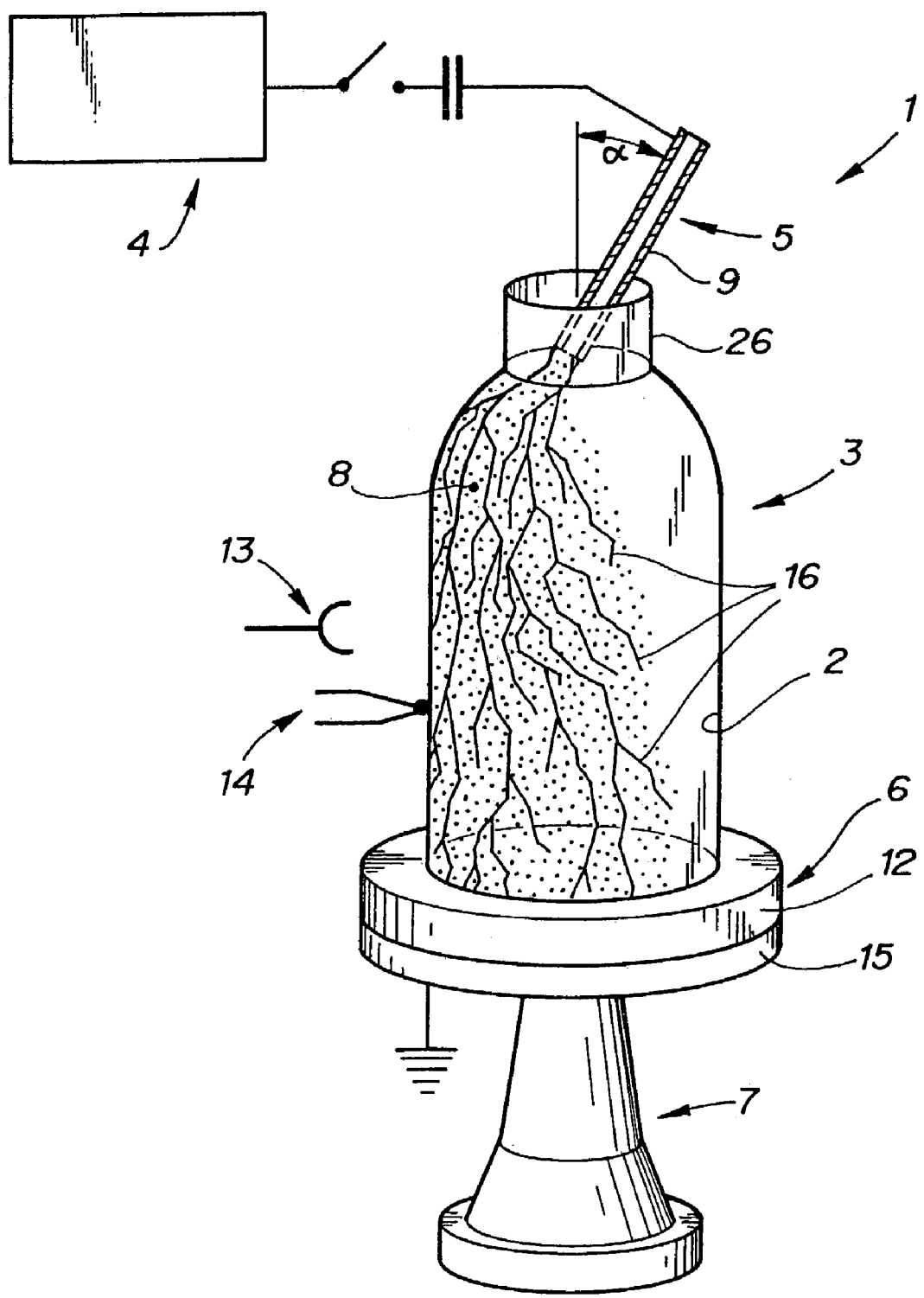

In FIG. 3a, a device 1 for the treatment of an inner surface 2 of an object to be treated 3, here a bottle, comprises a device for plasma generation 4 by electrical pulse discharges that is provided with a gas supply system comprising a duct 9 which can also function as live electrode 5, a holding device 6 with an insulating element 12 for holding the object to be treated, and a grounding electrode 15. The treatment device 1 can also include an external vibration generator 7, here an ultrasound generator, that can cause the inner surface 2 of the bottle to vibrate, a vibration pickup 13 that can be connected to a command module of the vibration generator 7, and a temperature sensor 14, for instance a thermocouple, to check the temperature of the container wall.

A plasma 8 is created inside the container 2 by current pulses flowing from the central electrode 5 that is working in the electric or autoelectronic field emission mode (as defined in the monograph of S. Krapivina, Plasmachemical processes in engineering, Chemistry Publ., Leningrad (1981), p. 27) to the grounding electrode 15. The grounding electrode 15 is arranged and shaped so that it can sustain the amplitude of the applied electric field and admit the creation of branched plasma discharges consisting of a superficial network of plasma filaments 16. The amplitude of the applied electric field must be large enough to ensure discharge initiation by breakdown.

Electrode 5 which also functions as a duct 9 through which the process gas is introduced into the container can be inclined forming an angle α to the container's axis of symmetry, so as to favor plasma formation along its inner surface 2. A gas having a weak ionization energy is used, such as argon, in order to optimize discharge localization along the container's inner surface.

Referring to FIGS. 5 and 6, the branched plasma discharge is developed by a current pulse (I) having a rising flank of duration $t_1$ so that the plasma inside the filaments of the branched discharge starts to form and heat up isochorically. The duration or time band designated as $t_1$ in FIG. 5 corresponds to the phase of isochoric heating of the plasma filaments. For duration $t_1$ one has the relation: $t_1 < d/a$, where d is the diameter of the filament when being created, and a is the speed of sound in the non-ionized medium surrounding the filament. Typically d~1 mm and a~$3 \cdot 10^2$ m/s so that $t_1 < 3 \cdot 10^{-6}$ s.

At the end of time $t_1$ the pressure rise inside the filament, which depends on the features of discharge development, and particularly on the heating of the plasma supplied with energy by the current, generates a shock wave exciting and ionizing the gas around the filament. The activation is intense above all in zone 19 between plasma filament 16 and the surface to be treated 2, on account of the incident wave 17 intersecting with the wave 18 reflected from the surface to be treated. The current that is initially localized in this filament, after development of the aforementioned shock waves passes mainly to the zone 19 that is restricted to the reflected wave 18 within which a cold plasma out of thermodynamic equilibrium develops which has a very good contact with the surface to be treated.

The amplitude of the energy developed by the electric current pulse is such that part of the energy of the incident shock wave is transmitted to the material of the object to be treated, via a penetrating shock wave 20 which is dissipated in the form of vibrations at eigenfrequencies of the object to be treated, which can be in the range of audible frequencies or of ultrasonic frequencies. The presence of vibrations can be controlled advantageously with the aid of an acoustic sensor 13 in the treatment device. These acoustic vibrations will subject the atoms of the object to be treated to oscillations which make them depart from and return to their positions of static equilibrium, and during their departure create a situation that favors their chemical union with the particles of the medium that is ionized and activated by the plasma, for instance with silicon and oxygen atoms during deposition of a $SiO_x$ film.

FIG. 7 shows records of the vibration frequencies of a PET bottle (0.5 liters) obtained during the treatment by a HF pulse discharge producing a branched jet of plasma filaments according to the invention. One sees that the trains of acoustic vibrations having a relatively large amplitude have frequencies which more particularly are about 6080 Hz and 10,000 Hz.

Particularly in the ultrasonic region, acoustic vibrations applied during the surface treatment exert a catalyzing role that is similar to an increase in temperature of the object to be treated. Ultrasonic vibrations have the advantage that the object to be treated remains relatively cold as compared to traditional plasma treatment processes, since the energy of the ultrasonic vibrations is dissipated in the volume bordering the shock wave, rather than locally. Thus, the heating of the object to be treated that results from dissipation of the waves will be relatively slight.

The current pulses should anyhow be limited in time. The energy set free during current flow in the plasma, which at first is out of thermodynamic equilibrium, is expended on one hand for activating the carrier gas particles (for example, $O_2$, O, Si, maybe C, H), on the other hand for heating the object to be treated, as well as the plasma itself, which increases in volume. These last-mentioned effects constitute a certain disadvantage for the surface treatment and should be eliminated. In fact, when films are deposited on the surface to be treated, the bulk plasma heating favors the formation of powder which will deposit on the surface to be treated, and contaminate it, resulting for instance in poor adhesion of the film to the surface to be treated and in poor barrier quality.

Returning to FIG. 5, the time band designated by $t_2$ in FIG. 5 corresponds to a phase of expansion of the plasma filaments. The current pulse duration $t_2$ is selected such that the plasma remains cold and develops along the surface to be treated, and that the temperature of the object to be treated will not rise above its temperature of destruction. This can be controlled by temperature measurements of the object during or immediately after its treatment with a temperature sensor, for instance a thermocouple 14 positioned close to or on the object to be treated, as shown in FIG. 3, and connected to the plasma generation device 4. In an industrial process, the sensor can be employed in the phase of startup to adjust and calibrate the plasma generation parameters, and particularly the pulse duration $t_2$ and pulse interval duration $t_3$.

On the other hand, the current pulse duration $t_2$ must be sufficient to activate and precipitate a maximum number of particles from the plasma-chemically activated medium onto the surface to be treated, which is verified by evaluating the actual results of the treatment on a certain number of samples.

As the plasma filaments that trigger the mechanism described above are spaced relatively far apart, the pulses must be repeated in order to uniformly coat the entire surface to be treated. The time interval $t_3$ between two pulses should be longer than the "post-discharge" plasma lifetime $t_4$ (as defined, for instance, in the monograph of A. Ricard, Plasmas Réactifs, SFV, 1995), and long enough so that the particles that have precipitated on the surface to be treated and have been brought in contact with the particles of the surface itself, can attain their final stable (or metastable) state that will be determinant for the required properties of the surface to be treated, in order for the filaments not to return onto the sites of prior filaments when a new pulse is applied.

For instance, during deposition of a polymer film based on the plasma precipitation of a mixture of activated C, H, and $CH_y$ particles, the time interval $t_3$ between the plasma pulses should be such that between the plasma pulses the polymerization process can be completed on the surface to be treated. This completion is advantageously accelerated by the presence of acoustic vibrations.

For plasmas containing elements, or compounds, such as $O_2$, $N_2$, $H_2$, Si, and C, the time interval between pulses will preferably be $t_3 \geq 1$ to 10 ms.

Advantageously, an acoustic vibration, preferably in the region of ultrasonic frequencies, that is being applied to the object to be treated, prior to the plasma treatment, offers the advantage of promoting the expulsion of foreign gases absorbed in the surface layers of the surface to be treated. Through the expulsion of these absorbed gases, it can be avoided that during local heating of the material by the plasma, a flux of these gases would be created that opposes the flux of activated plasma particles and would prevent them from reaching the surface to be treated.

Advantageously, by applying an acoustic vibration after the plasma treatment to the object to be treated one will be able to expel the residual gases and the powder particles that might have become adsorbed during treatment on the treated surface.

The acoustic vibrations of the object to be treated which arise from the creation of a branched network of plasma filaments according to the invention can be supplemented by acoustic, and particularly ultrasonic, vibrations from an external source such as an ultrasonic vibration generator. The frequency can be selected so as to be equal to one of the eigenfrequencies of the object to be treated, which can be measured with a vibration pickup. In this case the resonance effect will substantially improve the quality of the applied treatment. Other advantageous frequencies exist at which the ultrasonic vibration of the object to be treated can be amplified, particularly the frequency a/D, where D is the diameter of the container and a is the speed of sound.

FIGS. 4a and 4b show photographs taken with a high-speed camera of a branched plasma discharge generated with a device such as described in relation to FIGS. 3, 5, and 6. In the case illustrated, the bottle rests on a plate that is grounded and in contact with an acoustic vibration generator. The parameters for plasma creation used in these examples are:

in FIGS. 4a and 4b, $t_1 = 2$ μs, $t_2 = 300$ μs, $t_3 = 2$ μs, photographic exposure time: 0.5 ms, vibration frequency of the external vibration generator: f=120 kHz;

in FIG. 4a, electric threshold potential U=15 kV, process gas: argon;

in FIG. 4b, electric threshold potential U=10 kV, process gas: a mixture of hexamethyldisiloxane, oxygen, and argon.

The branched plasma filaments being created move rapidly along the surface to be treated, and vanish. Each discharge is preceded by a superficial breakdown such as represented by the voltage peak 53 in FIG. 5, which gives rise to a precursor channel. The lifetime of these branched filaments corresponds to the pulse frequency of the current source that creates them. The filament network covers large part of the surface to be treated, according to the photographs, and the filaments follow the exact shape of the surface irregularities of this surface, including the bottom.

The inventors of the present invention have realized that in traditional processes the plasma tends to become detached from the surface of the object to be treated, since the motion of the object or electrode gives rise to gas motions that perturb the plasma and particularly the air inflows brought about by the boundary layer of the container wall which tend to repel the plasma from the surface to be treated. When the plasma moves away from the surface to be treated, this diminishes or cancels the concentration gradient of the active particles on the surface to be treated, and thus prevents the surface treatment, such as deposition of a film. In the present invention, the problem is avoided by the fact that the duration of the current pulses creating the plasma in the shape of a branched filament network is selected to be short enough to ensure that the motion of the surface to be treated is so small relative to the spot occupied by the network that the pulse duration $t_2$ is smaller than the ratio (d/v) between the width (d) of a filament and the speed (v) of motion of the surface to be treated in relation to the plasma. Assuming that this speed be 1 m/s (a speed that is often realized in practice), and that the width of a filament is 1 mm, a maximum value of $10^{-3}$ s is obtained for $t_2$. The pulse duration $t_2$ is actually subject to an even stricter condition, viz., the limitation imposed on the temperature of heating of the surface to be treated. The tests performed while developing this invention have shown that this requirement limits the pulse duration $t_2$ to a value not in excess of about $3 \cdot 10^{-4}$ s. The high-frequency photographs such as those of FIGS. 4a and 4b show that during this time period, the filaments remain attached to the surface to be treated, and that no hydrodynamic effect is observed.

For an optimum scanning of the surface to be treated by the branched plasma network, such as that shown in FIGS. 3a and 3b, one can move the plasma filaments further apart or closer together, in other words, vary the density of the bundle of plasma filaments, by selecting the shape and position of the grounding electrode 15. In FIG. 3a, for instance, one sees a branched bundle of low density, while in FIG. 3b one sees a bundle of plasma filaments highly concentrated on account of having placed an electrode 15' of small surface area outside, and radially disposed relative to the axis of symmetry of the bottle underneath the insulating holder 12.

For the plasma to sweep all of the container surface, one can carry out a relative motion between the grounding electrode and the object to be treated, for instance by rotating the holder 12 on which the container sits, or by rotating the live or grounding electrode while keeping the holder at rest, or also by moving a magnetic or electromagnetic field or generating a hydrodynamic effect in the process gases.

So as to simplify the device, one can advantageously achieve the plasma sweep along the surface to be treated, by moving the process gas supply nozzle, for instance by performing a rotation about the axis of axial symmetry of the bottle as shown in FIGS. 3a to 3c. One can also improve the scanning by a treatment device such as shown in FIG. 3c, which has a gas supply device 5' provided with a feeding head 24 having a plurality of inclined ducts 9a, 9b, 9c forming an angle α with the axis of symmetry of the bottle, and distributed around this axis of symmetry. The ducts 25 can at the same time serve as electrodes coupled to the plasma generation device 4. The feeding head 24 can be mounted so as to be rotating relative to the holder 12 of container 3. The device allows a plurality of branched plasma jets 8a, 8b, 8c to be generated which are distributed around the inner surface of this container. Rotating the process gas supply ducts causes the plasma to be rotated through hydrodynamic and electrostatic effects. The hydrodynamic effect also improves the evacuation of residual gases after the treatment.

The entire surface of the container can therefore be treated, either by one or several sweeps of the plasma when the grounded electrode or the live electrode which serves at once as the process gas supply duct is moved, or by repeated pulses on the entire surface to be treated, but without motion of the latter.

An important aspect in the realization of the process is the feeding of the gas mixture to the surface to be treated. The gases that bring the molecules for deposition of a film, an impermeable film for instance, can be mixed with the gas used for plasma formation, and supplied through the ducts 9, 9a, 9b, 9c in the live electrode, they can be present in the container 3 prior to the start of surface treatment, or they can be supplied into the container by a separate source. The nozzle of the live electrode may direct the gases for film coating downstream of the forming plasma. It is important that the breakdown voltage in the gas mixture be lower than that of ambient air. For this reason the gas mixture preferably contains argon. The supply system is designed for the consecutive utilization of several gas mixtures having different compositions which will allow a barrier film to be created, for instance, in the form of several layers having different chemical compositions. The deposition of a barrier film on the inside of a bottle can advantageously be terminated with the deposition of an organic layer of the type of $C_xH_y$ that will prevent foaming of a carbonated liquid subsequently filled into the bottle.

A critical region of the object to be treated, particularly in the case of objects having a narrow neck such as bottles or the part of the inner surface close to the open end of the container (for instance of a cylindrical plastic tube), is the inclined or receding part of the inner surface close to the neck. It is advantageous in order to ensure an efficient surface treatment of this part to have ducts 9a, 9b, 9c inclined by an angle α relative to the axis of axial symmetry of the container or at least the part close to the part of the neck 26.

In the particular case where the object to be treated is a plastic tube, it turns out to be important, for instance during a treatment by which a barrier is deposited, not to treat the end of the tube that is to be closed, since the deposited film may prevent the welding of this end after filling of the tube by a consumer good. In this case angle α will be so selected that the gas mixture fed through ducts 9, 9a, 9b, 9c will contact the wall to be treated, only below the annular surface that should not be treated. In the particular case where a bottle is treated, it is possible at the end of the operations to only coat the lower part of the bottle with a polymer layer preventing foaming of the beverage during filling, while the neck lacks this layer and hence favors foaming. This would cause the beverage to foam when poured, an effect desired in the case of beer.

By adequate selection of the angle α one can also minimize the accumulation of residual treatment products, by admitting a circulation of the gases toward the open side of the container, here the neck. One also can inject the feed gases as a coaxial cone to an axisymmetric object to be treated, so that the feed gases are uniformly distributed over all of the surface to be treated. In this case the residual gases are evacuated by a central evacuating duct along the axis of this cone.

By virtue of the contact between the plasma and the surface to be treated by a process according to the invention, one can deposit barrier layers, for instance layers containing $SiO_x$ which is cheap and well suited for containers intended for food, by the following effects. First the gases absorbed in the walls of the object to be treated are desorbed by the acoustic effect of a shock wave arising with the creation of the plasma and/or coming from an external source of ultrasonic vibrations, and are thus eliminated from the wall's surface layer. The plasma might also produce a superficial etching of some atomic layers liberating chemical bonds which will react with the excited particles in the plasma, particularly certain particles such as silicon and oxygen fed with the surface treatment gas. The mechanism is not fully known, but it may be that the $SiO_x$ molecules occupy chemical bonds at the polymer surface and function as crystallization sites for formation of a barrier layer of $SiO_x$ on the surface to be treated.

For the creation of flexible, nonbreaking barrier films having good adhesion to the walls, it is possible through the present invention to successively deposit layers having different chemical compositions, and in particular to superimpose layers of $SiO_x$ and $CH_y$ nicely adhering to the substrate and to each other.

In the embodiment of FIG. 8 for treatment of the inner surface 2 of a container 3 of complex shape, the pulse discharge of plasma in the shape of a plasma filament network is formed between a live electrode 5 serving at once as a process gas duct and a grounding electrode 15 that can be moved in three dimensions by a mechanism (not shown) allowing electrode 15 to run across all of the outer surface of the container so as to pull a branched plasma filament network across all of the inner surface 2 of the container.

In the embodiment of FIG. 9, the surface treatment of a container 3 of complex shape (for instance a gasoline tank) is carried out as follows. A live electrode 5 supplied by a current source 4 is situated on the outside of an enclosure 27 of the device. The container 3 is placed inside the enclosure 27, which is made of insulating material and ventilated by a flow of air or other gas 28. Two ducts 29, 30 are used to bring the gas mixture into the tank 3 and to evacuate the residual gases from the tank, respectively. The tank can be moved and rotated through a mechanism holding the tank (not shown).

The grounded electrode can have the form of an electrically conducting liquid jet 31 coming from an injector 32 supplied by a pump 33. The electrically conducting liquid 34 collecting on the bottom 35 of the enclosure is continuously recirculated into the system of the grounded electrode. The discharge between said electrodes develops in the form of a branched plasma filament network 8.

In the embodiments of FIGS. 10 and 11, two solutions for the simultaneous treatment of internal and external sides 2a, 2b of the wall of a container 3 made of insulating material are shown.

In the embodiment of FIG. 10, discharges are produced so that the branched plasma filament networks 8a and 8b are formed in an alternating way to both sides of the wall while the two electrodes 5a, 5b are connected to opposite poles of the electrical circuit 54 of the plasma generation device 4. The container is placed on a holder 6 made of insulating material that can be rotated.

In the embodiment of FIG. 11, the electrical arrangement proposed allows the discharges to be carried out in the form of branched plasma filament networks 8a, 8b supplied in parallel. The tank 3 is in this case placed on a holder 12, and the two discharges make use of one grounded electrode 15.

In these two embodiments, live electrodes 5a, 5b serve as gas ducts. The gas mixtures sustaining the discharges may differ between the two sides of the container wall so that deposits having different compositions and properties might be formed.

In the embodiment of FIG. 12, the discharges are generated such that the branched network of plasma filaments 8a, 8b are formed on the inner surfaces of the recipients 3a, 3b placed one next to the other. The two electrodes 5a, respectively 5b, are connected to opposite poles of the electric circuit 54 of the plasma generation device 4, such that the plasma filaments 8a, 8b are attracted together by electrostatic forces which help in applying them against the inner surface of the recipients 3a, respectively 3b.

As in the other embodiments, the recipients 3a, 3b may be placed on rotatable dielectric supports 12 that also comprise a grounded electrode 15.

A plurality of pairs of containers 3a, 3b supplied by electrodes pairs 5a, 5b connected to opposite poles of an electrical circuit 54, as shown in FIG. 13, may be treated successively by means of an electronic or electrical switch 56.

In the embodiments of FIGS. 12 and 13, it may be noted that the formation of branched network of plasma filaments 8a, 8b against the internal surfaces of the containers placed one next to the other, is advantageous in view of the good application of the plasmas against the surface to be treated due to their mutual attraction. The plasmas thus espouse the interior shape of the containers, thus ensuring a uniform and effective treatment over the all innersurface of the container.

The process claimed can be put to practice with equipment consisting essentially of two conveyors feeding and withdrawing the objects to be treated, and a rotating circular tray at the periphery from where the objects to be treated are moved, each provided with a system of distribution of the gas mixtures, a current source, appropriate devices for measurements and checks, and one or more sources of acoustic vibrations, particularly ultrasonic vibrations, ensuring realization of the process. The sources of acoustic vibrations may be mounted onto the container bottom holders, so as to enhance the efficiency of the treatment on the container bottom surface. The current sources can be arranged to serve groups of objects to be treated.

During its treatment, each of the objects to be treated could be subjected to air cooling by forced convection to the object's untreated wall, for instance to the side not treated, when dealing with a container being treated.

In one mode of realization of the invention the objects to be treated could be immersed into a liquid through which they would be subjected to the uniform action of acoustic vibrations, and particularly of ultrasonic vibrations, over their entire surface. This could for instance be bottles or other containers partially immersed into the liquid bath, with the necks remaining outside, so that the liquid would be in contact with the container's outer surface, which has the advantage that the container walls can be cooled very efficiently and the plasma applied for a longer time. On the other hand, when an external source of vibrations is employed, the liquid allows these vibrations to be more uniformly distributed over the container walls, and thus to produce more uniform vibrations on the container's inner surface to be treated.

For simpler electrical connections to the treatment device, this device can be provided with a system of capacitors through which the high-frequency (HF) electrical energy is transmitted to the live electrodes without the need for a direct contact.

In the deposition of films on containers consisting of transparent, amorphous material, the treatment device may advantageously include a system of laser beams for quality control of the film deposited. Such a system will record, either the number of photons emitted by non-linear effects while the laser beam passes through said film or the decrease of the flux of primary photons caused by their recombination as a result of non-linear effects.

In an etching treatment carried out by plasma at an object such as a single-crystal silicon wafer onto which a microelectronic structure partly protected by masks consisting of photoresist material is deposited, one can advantageously apply a wave motion to the object to be treated, in a particular direction such as perpendicularly to the wafer surface, so as to produce an anisotropic etching. The degree of anisotropy will depend on the amplitude and frequency of the wave motion imposed upon the surface to be treated.

When the object to be treated is a metal sheet, a plastic foil, or a textile sheet, then this object can be subjected to the simultaneous action of a plasma flux scanning the surface of this object and of a vibrating motion of the object which will intensify the cleaning, degreasing, etching treatment or film deposition caused by the plasma flux.

A similar and equally efficient realization is feasible when the object to be treated is a metallic wire, textile fiber, or polymer filament.

Another embodiment of the present invention consists in generating the plasma simultaneously in two spots on the surface of an asymmetrically shaped object to be treated, for instance a container of large volume and complicated configuration, where two high-frequency discharges in the form of branched plasma filament networks are produced between two capacitive electrodes provided with a scanning motion along the outer surface of the object to be treated.

A mode of plasma generation constituting great practical interest consists in generating plasma by adiabatic (isentropic) compression. A device for treatment by generation of such a plasma is shown in FIG. 14.

The treatment device 1 includes an enclosure 36 comrpising a section that is the chamber of piston 37 and a section containing the seats for the objects to be treated 38, a solid piston 39, a gas compression device 40 provided with means for rapid expansion, an acoustic vibration generator 7, an entry duct for the process gas with valve 41, and a duct for gas evacuation with valve 42. The section with the seats for the objects 38 comprises a portion of side wall 43, a portion of bottom wall 44 fixed to the portion of side wall via a vacuum seal and vibration damping device 45. Piston 39 is mounted so as to slide inside the piston chamber 37 of enclosure 36, while the section of the chamber above the piston can rapidly be filled by high-pressure gas generated by the gas compression device 40 that is connected to this section of the chamber by a duct 46. An exit duct 47 with valve 48 allows the gases to be evacuated from the section of the enclosure above the piston when the piston 39 is lifted back up. The entry and exit duct 41, 42 allows the section with the seats of the objects to be filled with process gas, to evacuate the gas after treatment, and to fill it again with process gas.

When the piston is at the upper dead center, then the interior of the enclosure is first evacuated by a vacuum pump (not shown) connected to exit 42, then filled with a process gas supplied by the entry duct 41. The compression device 40 includes a compressed-air reservoir connected via an actuating valve with the section of the enclosure above the piston. The piston 39 is pushed downward by the compressed air and only stops when at the lower dead center 50.

The dimensions (diameter and height) of the enclosure, the initial process gas pressure, and the pressure exerted on the piston are so calculated that during its motion from the upper dead center 49 to the lower dead center 50, the piston compresses the process gas along the adiabatic curve of Hugogniot.

The plasma is generated by adiabatic compression. It pushes the piston back, the piston returning to its upper dead center 49 while the gas above the piston is evacuated during its up-stroke via the duct 47. This embodiment has the advantage that the plasma is generated uniformly throughout the treatment space, so that the treatment will be carried out in a uniform way on all sides of the objects to be treated which are present in the enclosure.

The dynamics of the compression process is calculated so that a plasma having given parameters is formed in the treatment zone of the enclosure, and that vibrations are generated by the external source of vibrations 7 operating preferably at one of the eigenfrequencies of the objects to be treated, or at a multiple of one of the eigenfrequencies.

Another mode of plasma generation that may also be of practical interest is the generation of plasma by a shock wave. A device allowing such a plasma to be generated is schematically illustrated in FIGS. 15a to 15c.

The treatment device 1 according to FIG. 15a comprises an enclosure 36 with a first section 37 holding compressed gas that is connected via a duct 46 with a valve to a gas compression device 40, and a section housing the objects to be treated 38, with a process gas entry duct 41 provided with a valve and a process gas evacuation duct 42 provided with a valve. The section housing the objects to be treated comprises a portion of side wall 43 and a bottom portion 44 which are joined via a vacuum seal acting as vibration absorber 45. The device further comprises an external ultrasonic vibration generator 7 arranged underneath the bottom portion 44. A removable separating wall 51 can be arranged so as to hermetically separate the section holding the compressed gas 37 from the section housing the objects to be treated 38.

At the start of the treatment process a vacuum pump connected to the evacuating duct 42 empties the section 38 of the enclosure which subsequently is filled with a process gas supplied by the entry duct 41. The compression device 40 compresses a process gas in the section holding the compressed gas 37. Finally the removable wall 51 is abruptly lifted in order to connect the two enclosure sections 37, 38.

The dimensions (diameter and height) of the enclosure, the initial pressure of the process gas, the position of the separating wall, the pressure of the compression gas, and other parameters are so calculated that the process gas compression behind the shock wave occurs according to the adiabatic curve of Poisson. The dynamics of the compression process produced by the incident and reflected shock wave is calculated in such a way that a plasma of given parameters is formed in the zone of the object to be treated. The object 3 is subjected to the plasma-chemical action of the plasma created behind the reflected shock wave 52', the plasma resulting from the twofold compression by the incident wave 52 and the reflected wave 52'. Part of the energy of the incident shock wave 52 is absorbed by the object to be treated 3, in the form of a shock wave 52" propagating inside the object at the speed of sound, which is rather higher that the speed of sound in the plasma. The wave inside the object is reflected at the opposite wall 26, and thus performs a forth-and-back motion becoming dissipated in the form of acoustic vibrations.

These vibrations of the surface of the object to be treated provoke an intensification of the plasma-chemical reactions between the plasma and the particles of the surface to be treated 2a. One can boost the amplitude of the vibrations by an external source of vibrations 7 emitting for instance a frequency close to or identical with one of the eigenfrequencies of the object or a multiple of this frequency.

However, the frequency of this external vibration can be selected so as to correspond, neither to the vibration frequency of the shock wave in the object to be treated nor to an eigenfrequency of the object to be treated.

Referring to FIG. 16, another embodiment is shown for forming a plasma in a reactor 36 in which gas and vapors $Q_1$ and $Q_2$ are introduced by the entry ports 41. The decomposition of the gas in the plasma forms clusters and powders, in particular nano-powders, whereby the degree of structuration, the form, and the quantity is determined by the simultaneous action of the plasma and ultrasonic vibrations. The vibrations are for example transmitted to the reactor by an ultrasonic generator 7, or generated in the chamber 36 by current pulses in the plasma as described previously, such that the front of development of the plasma has the characteristics described in relation to FIG. 5.

In this manner, for example, nano-powders of $SiO_2$ in the form of monocrystals having an average dimension of around 20 nm with a dispersion of ±20%, have been produced from the decomposition of hexamethyldisiloxane in a process gas comprising argon+oxygen. The productivity of the method was increased 35-fold, all other parameters being equal, by including an acoustic vibration of 45 kHz frequency (2 kW power) in the high frequency electrical discharge (HF) plasma (power 45 kW, diameter of the plasma flux: 35 mm).

In the device according to FIG. 16, the ultrasonic generator 7 comprises an ultrasound transmitter 58 mounted coaxially within the chamber 36, which in this example has a cylindrical shape, such that the powder particles are produced and treated in the annular space between the ultrasonic transmitter 58 and the wall of the chamber 36. The device may further comprise a cooling circuit 60 around a portion of the chamber 36 and having entry and exit ports 62, 64 for the circulation of a cooling liquid. The plasma 8 is created in a portion 66 of the chamber around which the electrodes 5 connected to a current source 4 are placed, for example a high frequency current source, for the generation of plasma in the portion 66 of the chamber, either by capacitive or inductive effect. If the external acoustic generator is supplied, the plasma may be created in the chamber by conventional means. However, in the absence of an external vibration generator, the acoustic vibrations may be generated by the process of generation of the plasma in pulses respecting the conditions described in relation to FIG. 5.

The device of FIG. 16 may also be used for the treatment of powder nuclei or grains, which for example may be introduced with the gas mixture $Q_1$, $Q_2$ in order to form composite powder grains. The plasma activates the atoms and molecules of the gas mixture that are in contact with the powder nuclei in order to form homogeneous atomic or molecular films or layers around the nuclei. The acoustic vibrations undulate the plasma ions or the grain nuclei, or both, such that the relative undulating movement between the nuclei surface and the plasma ions catalyzes the deposition process. The powder 70 thus produced or treated is collected in a collector 68 arranged under the outlet tube 36.

Another variant of the present invention comprises imposing an acoustic vibration for surface etching by plasma. The object to be treated is for example a semi-conductor plaque such as a mono-crystalline silicium plaque covered with a structure comprising masks, as commonly found in semi-conductor technology. The plasma is preferably an atmospheric plasma. The silicium plaque is wounded on a support and arranged to be subjected to an atmospheric plasma jet, in which etching gases, such as $CF_4$ are injected.

The support is subjected to an ultrasound vibration perpendicular to the plaque, for example at a frequency of 15 kHz.

Experiments have shown that on application of the ultrasonic vibration, cleaning may be effected in an anisotropic manner in the sense that the etching speed $v_{II}$ in the direction parallel to the vibrational movement (i.e. perpendicular to the surface of the silicium plaque) is superior to the etching speed in the perpendicular direction v. By varying the power P of the vibration between 0.1 and 2 kW, it was possible to obtain a ratio $v_{II}/v$ varying between 1.2 and 30. This ratio increases by a factor of 1.5 with an increase in the frequency of 15 to 45 kHz.

The plasma treatment process of the present invention may advantageously be used for cleaning, or etching, or scaling metallic sheets or wires. For example, an aluminum sheet passing through a plasma curtain may be cleaned of its oil or grease layer remaining after rolling. The application of an acoustic vibration intensifies the aforementioned treatment in a significant manner. For example, in a practical experiment, a virtual complete cleaning was obtained for a linear power density of 1 kW/cm of plasma for a sheet velocity through the plasma of 3 m/sec. By applying an ultrasonic vibration to the aluminum foil through the support or roller in contact with the foil (v=45 kHz, P=0.1 kW/cm), it was possible to reduce the electric power by half (that is 0.5 kW/cm) to achieve the same cleanliness results.

In the case of treatment of an internal or external surface of a hollow body of asymmetric shape, having for example the shape of a large volume container with complex configuration, it is possible to generate the plasma in the form of a branched network at two regions on the surface of the body to be treated, for example by two high frequency discharges in the form of a branched network of plasma filaments between two capacitive electrodes that sweep along the outer surface of the body.

By way of example, in a practical experiment, the internal surface of an automobile fuel reservoir made of a single layer polyethylene, was covered with a barrier film with the aid of high frequency plasma discharges at 13.56 MHz. The plasma discharges in the form of a branched network of filaments, were created in a gas mixture of argon, oxygen and HMDS. The average power of the discharge was 5 kW. In 60 seconds, the interior surface of the container was covered with a film of $SiO_2$ of 0.1 μm thickness, representing a barrier improvement factor for hydrocarbon molecules of around 1000.

Nonlimiting examples of realization of the process according to the invention are given hereafter.

EXAMPLE 1

Deposition of a silicon oxide film on the inner surface of a single-layer PET bottle (0.5 liters) by the HF method Base elements or compounds used consecutively and repetitively: Ar, $O_2$, Hexamethyldisiloxane (HMDS), $CH_4$ Maximum voltage of the current source: 21 kV
Discharge current amplitude: 10 A
$t_1$=3 μs
$t_2$=300 μs
$t_3$=40 ms
Duration of treatment: 30 s
Major barrier material: $SiO_x$ (x=1.96)
Barrier thickness: 180-190 Å
Magnitude of barrier for oxygen (volume of oxygen diffusing across the bottle wall per day):

| prior to treatment: | 0.06 cm³/bottle · day |
|---|---|
| after treatment: | 0.0001 cm³/bottle · day |

Relative barrier coefficient for oxygen: BIF*~60
Barrier coefficient for $CO_2$: BIF*~15
*) BIF=Barrier Improvement Factor

EXAMPLE 2

Deposition of a silicon oxide film on a single-layer polyethylene tube (200 ml)

Base products used consecutively: Ar, $O_2$, HMDS, TEOS, $CH_4$.

Maximum voltage of the current source: 10 kV
Discharge current amplitude: 8 A
$t_1$2 μs
$t_2$=200 μs
$t_3$=10 ms
Duration of treatment: 30 s
Major barrier material: $SiO_x$ (x=1.95)
Barrier thickness: 250 Å
Magnitude of barrier for oxygen:

| prior to inside treatment: | 0.7 cm³/tube · day |
|---|---|
| after inside treatment: | 0.005 cm³/tube · day |
| after outside treatment: | 0.1 cm³/tube · day |
| after treatment on both sides: | 0.002 cm³/tube · day |

Barrier coefficient for oxygen:
after inside treatment: BIF~140
after outside treatment: BIF~7
after treatment on both sides: BIF~350.

EXAMPLE 3

Deposition of a silicon oxide film ($SiO_2$) by decomposition of HDMS in an atmospheric plasma in the interior of the container (PET bottles) under the following conditions:

Frequency (v) of the undulations (exterior source of ultrasound with different energy densities) applied to the container during the plasma treatment:

$v=3.10^1$ kHz.

Amplitude (1) of the undulations (measured by a high speed camera: $10^6$ frames/sec):

$$1 = 1/v \cdot \sqrt{(E/\rho)}$$

where $\rho$ is the density of the treated material.

Increase of the temperature ($\Delta T$) of the container wall following an atmospheric plasma treatment (measured with an infrared pyrometer)

$$\Delta T = 10 \text{ K}.$$

In these conditions, the energy density (E) of the undulating movement is:

$$E_{und} = \frac{1}{2}\rho^2 v^2$$

The thermal energy density ($E_T$) communicated to the object by the plasma and corresponding to a temperature of $\Delta T$ de 10K is:

$$E_T = \rho c \Delta T$$

where c is the thermal capacitance of the material.

The ratio (R) of the above values is : $R = E_{und}/E_T = \frac{1}{2}l^2v^2/c\Delta T$.

Following the undulating regimes (1) imposed on the process, we have:

TABLE NO. 1

| $1_{(M)}$ | R | Thickness $\Delta$ of the layer obtained (measured by ellipsometry) (M) |
|---|---|---|
| $10^{-4}$ | $1, 8.10^{-3}$ | Not measurable |
| $2.10^{-4}$ | $8.10^{-3}$ | $\sim 1.10^{-8}$ |
| $3.10^{-4}$ | $1, 6.10^{-2}$ | $9.10^{-8}$ |
| $6.10^{-4}$ | $6.10^{-2}$ | $2.10^{-7}$ |

The result obtained by this experiment allows us to conclude that in the case of a film deposition by atmospheric plasma, the energy density of the undulating movement is superior to around one hundredth of the thermal energy density communicated to the body to be treated by the plasma. In a general manner, this implies that the application of an undulating movement only becomes effective when its intensity is such that the energy density of this movement is significant in relation to the increase in thermal energy of the body to be treated, the latter being proportional to the increase of the temperature of the body before and/or during treatment. The thermal energy may be communicated to the body to be treated by a heat source, in particular the heat source provided by the plasma itself.

In this example, le minimum ratio R of the energy densities, for which an undulating movement becomes effective, has been found to be around one over a hundred. Considering the complex nature of the interaction between the surface that is on the one hand undulating, and on the other hand heated, with the plasma, it is possible that the aforementioned ratio is around one hundredth for the particular process of depositing a silicium oxide film, but different for other processes, for example for etching, activation or sterilization of surfaces. In a general manner, it should thus be retained that the word "significant" means that the energy density of the undulating movement should be a significant fraction of the thermal energy density, probably above one thousandth. The example shows that the actual value of the ratio exists but needs to be determined for each particular situation.

EXAMPLE 4

During the film deposition treatment mentioned in Example 3, the thickness of the boundary layer concerning the diffusion of particles (Si) towards the wall surface to be treated, was estimated on the basis of estimations of the average temperature of the plasma based on spectroscopic data mentioned in the article: A. Kakliougin, P. Koulik, et al., "HF Atmospheric Plasma Sterilization of Dielectric Containers Inside Surface" CIP 2001, published by SVF; $1^{st}$ Edition May 2001, p. 28. According to these estimations, the thermal speed ($V_T$) of diffusing particles was estimated at $v^T \sim 10^3$ m/s. The concentration $n_s/n_{pl}$ of the diffusing particles of Si was measured by flow-meters and was equal to $10^{-5}$ (ratio of the particle density of Si to the total density of plasma particles), and the effective section of the diffusing particles was evaluated at $10^{-18}$ m$^2$ according to Braun (S. Braun, Basic Processes in Gas Discharges. Cambridge, MTI, 12, 1959).

The duration of treatment by plasma was $\Delta\tau = 30$ sec.

In these conditions, the thickness $\delta$ of the boundary layer for the regimes described in the preceding article is calculated according to the formula: $\delta = v_T \cdot n_s/n_{pl} \cdot \Delta\tau/Q\Delta n_{sol}$ where $n_{sol}$ is the density of particles of the deposited layer ($\sim 10^{28}$ m$^{-3}$), where the thickness is $\Delta$, and Q is the effective section of the diffusing particles.

According to the undulating regimes imposed in the process, we have:

TABLE NO. 2

| 1 (m) | 1/$\delta$ | $\Delta$ (m) |
|---|---|---|
| $10^{-4}$ | 0, 3 | Not mesurable |
| $2.10^{-4}$ | 0, 7 | $1.10^{-8}$ |
| $3.10^{-4}$ | 1 | $9.10^{-8}$ |
| $6.10^{-4}$ | 2 | $10.10^{-8}$ |

These results show that when the amplitude of the undulating movement is superior to the thickness of the boundary layer between the plasma and the object to be treated, we obtain, in these experimental conditions, a layer of silicium oxide of measurable thickness (in other words, the process is effective).

This result implies that the undulating movement applied to the surface to be treated is effective, once it provokes a turbulent plasma, the latter substantially intensifying the molecular exchange between the plasma and the surface to be treated, accompanied, for example, by film deposition as mentioned in this example.

EXAMPLE 5

Surface treatment of particles (nuclei) to form composite grains:

| | |
|---|---|
| Starting material: | $CO_3Ca$ nuclei powder (diameter approx. 300 nm) |
| Process gas: | argon |
| Temperature of the nuclei during treatment: | 850° C. |
| Secondary gas: | argon + $O_2$ + vapors of hexamethydisiloxane |
| Plasma generation parameters: | frequency 13, 56 MHz, power approx. 35 kW |
| Result obtained: | formation of a $SiO_2$ film of a thickness of approx. 100 nm around the $CO_3Ca$ nuclei. |

The invention claimed is:

1. Plasma treatment process of a surface to be treated of an object, comprising creation of a plasma, application of the plasma to the surface, and vibration of the surface, wherein excitation energy for vibration of the surface is at least partially supplied by the plasma creation process, and wherein said plasma is created in the form of an optically visible branched plasma filament network generating acoustic shock waves.

2. Process according to claim 1, wherein the surface to be treated is excited, in addition to the plasma creation process, by means of an external vibration generator.

3. Process according to claim 2, wherein the vibration generator is an ultrasound generator.

4. Process according to claim 2, wherein the vibration frequency of the generator is adjusted to a frequency close to or identical with one of the eigenfrequencies of the object to be treated.

5. Process according to claim 2 in cases of treatment of bottles, wherein vibrations are generated underneath a bottom of said bottle opposite to a neck of said bottle so as to enhance the treatment efficiency on the bottom.

6. Process according to claim 1, wherein the surface to be treated is excited by a shock wave produced during creation of the plasma.

7. Process according to claim 1, wherein the excitation of the surface to be treated is brought about just prior to and/or during and/or just after application of the plasma to the surface to be treated.

8. Process according to claim 1, wherein the plasma is created in a gaseous medium comprising a process gas that is activated plasma-chemically, the process gas being in contact with the surface to be treated.

9. Process according to claim 1, wherein the frequency and amplitude of vibrations of the object to be treated are measured by means of a vibration pickup in order to identify the eigenfrequencies of the object to be treated and/or to verify the vibration of the surface.

10. Process according to claim 1, wherein the plasma is generated by pulses, the lifetime of each plasma pulse generated being longer than the period of wave motion of the surface.

11. Process according to claim 10, wherein the pulses are generated by incident shock waves on the surface to be treated and shock waves reflected from the surface to be treated.

12. Process according to claim 10, wherein the pulses are generated by unipolar or high-frequency electrical current pulses.

13. Process according to claim 12, wherein the rise time ($t_1$) of the electric current amplitude of a pulse is shorter than the ratio d/v of diameter d of the plasma channel created, to the speed of sound v in the gaseous medium surrounding the plasma channel.

14. Process according to claim 12, wherein sonic shock waves are created by an electric breakdown during creation of a plasma channel or filament.

15. Process according to claim 12, wherein the length ($t_2$) of an electric pulse is adjusted so as to avoid superficial heating of the surface to be treated, above the critical temperature of instability of the material.

16. Process according to claim 12, wherein the interval between pulses ($t_3$) is longer than a post-discharge time ($t_4$) in order to allow a majority of particles of the surface to be treated, to attain a stable or metastable state.

17. Process according to claim 12, wherein the plasma is moved over the surface to be treated, by a relative motion between an electrode and the object to be treated and/or by a magnetic field in motion and/or by a hydrodynamic effect of a process gas in which the plasma is created.

18. Process according to claim 15, wherein the electric pulse length ($t_2$) is smaller than the ratio of the width of a plasma filament applied to the surface to be treated, to the velocity of motion of the surface to be treated relative to the plasma.

19. Process according to claim 1, wherein a plurality of said branched plasma filaments networks are simultaneously created.

20. Process according to claim 1, wherein the plasma is fed successively with process gases having different compositions, for different successive treatments of the surface.

21. Plasma treatment process of a surface to be treated of an object, comprising creation of a plasma, application of the plasma to the surface, and vibration of the surface, wherein excitation energy for vibration of the surface is at least partially supplied by the plasma creation process, and wherein said plasma is created in the form of a branched plasma filament network covering part of the surface to be treated and generating acoustic shock waves.

22. Plasma treatment process of a surface to be treated of an object, comprising creation of a plasma, application of the plasma to the surface, and vibration of the surface, wherein excitation energy for vibration of the surface is at least partially supplied by the plasma creation process, and wherein said plasma is created in the form of a branched plasma filament network generating acoustic shock waves, wherein the plasma is generated by pulses, the lifetime of each plasma pulse generated being longer than the period of wave motion of the surface, and wherein the plasma pulse is generated by an essentially adiabatic and isentropic compression of a gaseous medium comprising a process gas that is activated plasma-chemically.

* * * * *